(12) United States Patent
Nguyen et al.

(10) Patent No.: US 11,968,395 B2
(45) Date of Patent: *Apr. 23, 2024

(54) TRANSFORM COEFFICIENT CODING

(71) Applicant: GE Video Compression, LLC, Albany, NY (US)

(72) Inventors: Tung Nguyen, Berlin (DE); Heiner Kirchhoffer, Berlin (DE); Detlev Marpe, Berlin (DE)

(73) Assignee: GE Video Compression, LLC, Niskayuna, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 18/188,744

(22) Filed: Mar. 23, 2023

(65) Prior Publication Data
US 2023/0269398 A1 Aug. 24, 2023

Related U.S. Application Data

(63) Continuation of application No. 17/136,716, filed on Dec. 29, 2020, now Pat. No. 11,616,982, which is a
(Continued)

(51) Int. Cl.
*H04N 19/60* (2014.01)
*H03M 7/40* (2006.01)
*H04N 19/91* (2014.01)

(52) U.S. Cl.
CPC .......... *H04N 19/60* (2014.11); *H03M 7/4018* (2013.01); *H03M 7/4075* (2013.01); *H04N 19/91* (2014.11)

(58) Field of Classification Search
None
See application file for complete search history.

(56) References Cited

U.S. PATENT DOCUMENTS

| 7,088,271 B2 | 8/2006 | Marpe et al. |
| 7,218,790 B2 | 5/2007 | Smirnov |

(Continued)

FOREIGN PATENT DOCUMENTS

| AU | 2016204082 B2 | 7/2016 |
| CN | 1379366 | 11/2002 |

(Continued)

OTHER PUBLICATIONS

Detlev Marpe, Member, IEEE, Heiko Schwarz, and Thomas Wiegand, "Context-Based Adaptive Binary Arithmetic Coding in the H.264/AVC Video Compression Standard", IEEE Transactions on Circuits and Systems for Video Technology, vol. 13, No. 7, Jul. 2003 (Year: 2003).*

(Continued)

*Primary Examiner* — Xiaolan Xu
(74) *Attorney, Agent, or Firm* — Morgan, Lewis & Bockius LLP

(57) ABSTRACT

An idea used herein is to use the same function for the dependency of the context and the dependency of the symbolization parameter on previously coded/decoded transform coefficients. Using the same function—with varying function parameter—may even be used with respect to different transform block sizes and/or frequency portions of the transform blocks in case of the transform coefficients being spatially arranged in transform blocks. A further variant of this idea is to use the same function for the dependency of a symbolization parameter on previously coded/decoded transform coefficients for different sizes of the current transform coefficient's transform block, different information component types of the current transform coefficient's transform block and/or different frequency portions the current transform coefficient is located within the transform block.

29 Claims, 12 Drawing Sheets

Related U.S. Application Data continuation of application No. 16/985,572, filed on Aug. 5, 2020, now abandoned, which is a continuation of application No. 16/745,696, filed on Jan. 17, 2020, now Pat. No. 10,757,447, which is a continuation of application No. 16/522,884, filed on Jul. 26, 2019, now Pat. No. 10,582,219, which is a continuation of application No. 16/285,761, filed on Feb. 26, 2019, now Pat. No. 10,462,487, which is a continuation of application No. 15/948,085, filed on Apr. 9, 2018, now Pat. No. 10,271,068, which is a continuation of application No. 15/621,702, filed on Jun. 13, 2017, now Pat. No. 10,045,049, which is a continuation of application No. 14/335,439, filed on Jul. 18, 2014, now Pat. No. 9,712,844, which is a continuation of application No. PCT/EP2013/051053, filed on Jan. 21, 2013.

(60) Provisional application No. 61/588,846, filed on Jan. 20, 2012.

(56) References Cited

U.S. PATENT DOCUMENTS

| | | | |
|---|---|---|---|
| 9,106,913 | B2 | 8/2015 | Rajals |
| 9,197,890 | B2 | 11/2015 | Rajals |
| 9,338,449 | B2 | 5/2016 | Rajals |
| 2003/0156652 | A1* | 8/2003 | Wise .................. G06F 13/1673 375/240.26 |
| 2005/0038837 | A1 | 2/2005 | Marpe et al. |
| 2006/0023795 | A1 | 2/2006 | Kim |
| 2007/0223579 | A1 | 9/2007 | Bao |
| 2008/0162432 | A1 | 7/2008 | Wang |
| 2009/0096643 | A1 | 4/2009 | Chang |
| 2010/0232720 | A1 | 9/2010 | Tsai et al. |
| 2010/0316118 | A1 | 10/2010 | Li |
| 2012/0014454 | A1 | 1/2012 | Budagavi |
| 2012/0121011 | A1 | 5/2012 | Coban et al. |
| 2012/0243615 | A1 | 9/2012 | Tu et al. |
| 2013/0224051 | A1 | 8/2013 | Okada et al. |
| 2014/0348247 | A1 | 11/2014 | Tsukuba et al. |
| 2016/0100192 | A1 | 4/2016 | Sze et al. |

FOREIGN PATENT DOCUMENTS

| | | |
|---|---|---|
| CN | 1656817 A | 8/2005 |
| CN | 1735209 A | 2/2006 |
| CN | 1741616 A | 3/2006 |
| CN | 101115201 A | 1/2008 |
| CN | 101682770 A | 3/2010 |
| CN | 101883280 A | 11/2010 |
| CN | 101908070 A | 12/2010 |
| CN | 102017634 A | 4/2011 |
| CN | 102273080 A | 12/2011 |
| CN | 104365107 A | 2/2015 |
| EP | 2999123 A1 | 3/2016 |
| JP | 2009100474 A | 5/2009 |
| JP | 2011-35682 A | 2/2011 |
| JP | 2011035681 A | 2/2011 |
| JP | 2011114369 A | 6/2011 |
| JP | 4886755 B2 | 2/2012 |
| JP | 2013524707 A | 6/2013 |
| JP | 2013223051 A | 10/2013 |
| JP | 2013537737 A | 10/2013 |
| JP | 6542831 B2 | 7/2019 |
| RU | 2406258 C2 | 12/2010 |
| RU | 2010 101 116 A | 7/2011 |
| TW | 201142759 A | 12/2011 |
| WO | 2009092454 A1 | 7/2009 |
| WO | 2011128268 A1 | 10/2011 |
| WO | 2011128303 A2 | 10/2011 |
| WO | 2012005551 A2 | 1/2012 |
| WO | 2012/095488 A2 | 7/2012 |
| WO | 20131079081 A1 | 7/2013 |

OTHER PUBLICATIONS

Davide Bardone, Elias S. G. Carotti, Juan Carlos De Martin, "Adaptive Golomb Codes for Level Binarization in the H.264/AVC FRExt Lossless Mode", 2008 IEEE International Symposium on Signal Processing and Information Technology (Year: 2008).*
A. Kiely, "Selecting the Golomb Parameter in Rice Coding", ipnpr.jpl.nasa.gov, IPN Progress Report 42-159, Nov. 15, 2004 (Year: 2004).*
Office Action issued in corresponding Korean Patent Application 10-2022-7039112 dated Mar. 30, 2023, with English.
Non-final Office Action U.S. Appl. No. 15/948,085 dated Aug. 2, 2018.
Office Action Russian Patent Application No. 2017145307 dated Oct. 17, 2018.
Notification of Reasons for Refusal Japanese Patent Application No. 2017-083843 dated Oct. 9, 2018.
Sole et al., "CE11" Unified scans for the significance map and coefficient level coding in high efficiency, Joint Collaborative Team on Video Coding {JCT-Ve) of ITU-TSG16 WP3 and ISO/IEC JTC1/SC29/WG11, 6th Meeting Torino, Italy, Jul. 2011, JCTVC-F288, pp. 1-9.
Decision to Grant dated Nov. 20, 2018 in KR 10-2017-7019863.
Decision to Grant dated Nov. 20, 2018 in KR 10-2017-7023278.
Decision to Grant dated Nov. 20, 2018 in KR 10-2017-7023279.
Decision to Grant dated Nov. 20, 2018 in KR-10-2017-7023280.
Notice of Allowance U.S. Appl. No. 15/948,085 dated Nov. 26, 2018.
Notice of Allowance U.S. Appl. No. 16/285,761 dated May 1, 2019.
Notice of Allowance Philippines Application No. 1/2018/500139 dated Jun. 10, 2019.
First Office Action Chinese Patent Application No. 201710606288.0 dated Jun. 21, 2019.
First Office Action Chinese Patent Application No. 201710606085.1 dated Jun. 28, 2019.
Notification of the First Office Action Chinese Patent Application No. 2017106062880 dated Jun. 21, 2019.
Notice of Allowance Philippines Application No. 1/2018/500138 dated Jul. 9, 2019.
Office Action Canadian Patent Application No. 2861953 dated Jul. 4, 2019.
First Office Action Chinese Patent Application No. 201710606173.1 dated Jul. 22, 2019.
Office Action dated Jun. 21, 2019 in Mexican Application MX/a/2017 /003792.
Office Action dated Jul. 29, 2019 in Philippine Application 1-2018-500136.
Decision to Grant dated Aug. 5, 2019 in Ukrainian Application a 2017 00034.
Office Action dated Aug. 12, 2019 in Chinese Application 201710606400.0.
Office Action dated Aug. 12, 2019 in Chinese Application 201710607450.0.
Office Action dated Aug. 13, 2019 in Chinese Application 201710605816.0.
Notice of Allowance dated Aug. 15, 2019 in Israell Application 265447.
Office Action dated Aug. 16, 2019 in Chinese Application 201710606737.1.
Office Action dated Aug. 16, 2019 in Chinese Application 201710606937.7.
Office Action dated Aug. 16, 2019 in Australian Application 2018217277.
Office Action dated Aug. 27, 2019 in Chinese Application 201710607127.3.
Notice of Allowance dated Oct. 17, 2019 in U.S. Appl. No. 16/522,884.

(56) References Cited

OTHER PUBLICATIONS

Decision to Grant dated Sep. 27, 2019 in Russian Application 2017145307.
Notice of Allowance dated Oct. 4, 2019 in Mexican Application MX/a/2017 /003792.
Office Action dated Apr. 8, 2020 in Malaysian Application 2017001954.
Notice of Issuance dated Apr. 9, 2020 in Chinese Application 201710607450.0.
Notice of Allowance dated Apr. 9, 2020 in Chinese Application 201710606400.0.
Office Action dated Mar. 31, 2020 in Brazilian Application 112014017916-6.
Notice of Allowance dated Apr. 3, 2020 in U.S. Appl. No. 16/745,696.
Notice of Issuance dated Apr. 27, 2020 in Chinese Application 201710605816.0.
Notice of Issuance dated Apr. 27, 2020 in Chinese Application 201710606937.7.
Notice of Issuance dated Apr. 27, 2020 in Chinese Application 201710606737.1.
Notice of Issuance dated Apr. 27, 2020 in Chinese Application 201710606173.1.
Notice of Issuance dated Apr. 27, 2020 in Chinese Application 201710607127.3.
Office Action dated May 29, 2020 in Korean Application 10-2020-7009366.
Notice of Issuance dated Jun. 23, 2020 in Chinese Application 201710606288.0.
Notice of Allowance dated Jun. 10, 2020 in Israeli Application 270665.
Notice of Acceptance dated Jun. 23, 2020 in Australian Application 2018217277.
Office Action issued in corresponding U.S. Appl. No. 15/621,702 dated Jul. 31, 2017.
Office Action dated Aug. 4, 2020 in Philippine Application 1-2019-501221.
Office Action dated Jul. 28, 2020 in Japanese Application 2019-110162.
Notice Before Examination dated Sep. 13, 2020 in Israeli Application 277277.
Decision to Grant dated Dec. 31, 2019 in Korean Application 10-2019-7005066.
Office Action dated Dec. 2, 2019 in Russian Application 2019136699.
Office Action dated Nov. 25, 2019 in Philippine Application 1/2019/501221.
Office Action dated Feb. 3, 2020 in Chinese Application 201710606314.X.
Notice of Issuance dated Mar. 17, 2020 in Chinese Application 201710606085.1.
Office Action dated Mar. 23, 2020 in Chinese Application 201710606288.0.
Notice of Allowance dated Mar. 20, 2020 in Vietnamese Application 1-2019-04090.
Notice of Allowance dated Mar. 20, 2020 in Vietnamese Application 1-2019-04092.
Notice of Allowance dated Mar. 20, 2020 in Vietnamese Application 1-2019-04093.
Notice of Allowance dated Mar. 20, 2020 in Vietnamese Application 1-2019-06708.
Notice of Allowance dated Mar. 26, 2020 in Vietnamese Application 1-2019-04091.
Decision to Grant a Patent issued In corresponding Korean Patent Application No. 10-2020-7009366 dated Nov. 16, 2020, with English translation.
Decision to Grant issued in corresponding Russian Patent Application No. 2019136699 dated Jan. 13, 2021, with English translation.
Tung Nguyen et al., "Reduced-complexity entropy coding of transform coefficient levels using truncated Golomb-Rice codes in video compression", Image Processing {ICIP), 2011 18th IEEE International Conference on IEEE, Sep. 11, 2011, pp. 753-756.

Notice of Allowance issued in corresponding Mexican Application No. Mx/a/2020/000126 dated Oct. 16, 2020.
Decision to Grant a Patent issued in corresponding Japanese Patent Application No. 2019-110162 dated Dec. 15, 2020, with English translation.
Sasai, H., et al., "Non-CEII: Modified Context Derivation for last coefficient flag", [online], Nov. 25, 2011, Joint Collaborative Team on Video Coding (JCT-Ve) of ITU-T SG16 WP3 and ISO/IEC JTC1/SC29/WG11, Document: JCTVC-G520r2 (version 4), [Searched on Nov. 5, 2015], 19 pages.
Notice of Allowance issued in corresponding Japanese Patent Application 2021-004254 dated Jan. 10, 2023, with English translation.
Final Office Action issued in corresponding U.S. Appl. No. 16/985,572 dated Nov. 10, 2022.
Office Action issued in corresponding Russian Patent Application No. 2022127073/20(059196) dated Oct. 21, 2022, with English translation.
Office Action issued in corresponding Mexican Patent Application MX/a/2021/000563 dated Jun. 24, 2022.
Office Action issued in corresponding Korean Patent Application 10-2021-7026209 dated Aug. 11, 2022, with English translation.
Office Action (Decision to Grant and Search Report) issued in corresponding Russian Patent Application 2022117411 dated Aug. 17, 2022, with English translation.
Office Action (Decision to Grant) issued in corresponding Russian Patent Application 2021134557 dated May 17, 2022, with English translation.
Notice of Acceptance issued in corresponding Australian Patent Application No. 2020244522 dated Mar. 15, 2022.
Office Action (Notification of Reasons for Refusal) issued in corresponding Japanese Patent Application No. 2021-004254 dated Mar. 3, 2022, with English translation.
Office Action (Notice before Examination) issued in corresponding Israeli Patent Application No. 292629 dated May 1, 2022.
Office Action issued in corresponding U.S. Appl. No. 16/985,572 dated Apr. 13, 2022.
Office Action issued in corresponding Mexican Patent Application MX/a/2021/000563 with English translation dated Feb. 3, 2022.
Office Action issued in Korean Patent Application No. 10-2021-702 6209 dated Nov. 8, 2021, with English translation.
European Patent Office Decision to Refuse Application No. 15-186 946.8 dated Nov. 3, 2021.
Office Action issued in corresponding Australian Patent Application No. 2020244522 dated Aug. 4, 2021.
Office Action issued in corresponding Mexican Patent Application No. Mx/a/2021/000563 dated Sep. 15, 2021.
Office Action issued in corresponding Russian Patent Application No. 2021106361 dated Sep. 27, 2021.
Search Report issued in corresponding Russian Patent Application No. 2021106361 dated Sep. 23, 2021.
Summons to Attend Oral Proceedings issued in corresponding European Patent Application No. 15 186 946.8 dated Mar. 26, 2021.
Notice of Issuance issued in corresponding Brazilian Patent Application No. BR122020007580-5 dated Aug. 23, 2021.
Decision of Appeal Recourse issued in corresponding Chilean Patent Application No. 1887-2014 dated Apr. 27, 2021.
Office Action (Decision to Grant) issued in corresponding Korean Patent Application No. 10-2012-7004427 dated May 17, 2021, with English translation.
Office Action issued in corresponding Brazilian Patent Application No. 11 2014 017916-6 dated May 13, 2021.
Office Action issued in corresponding Mexican Patent Application No. Mx/a/2021/000563 dated Apr. 16, 2021, with partial translation.
Office Action issued in corresponding Brazilian Patent Application No. 1220200075805 dated Jun. 1, 2021.
Office Action issued in corresponding Israeli Patent Application No. 284378 dated Jun. 27, 2021, with partial English translation.
Office Action issued in corresponding Indian Patent Application No. 201938016665 dated Feb. 23, 2021, with English translation.
Office Action issued in corresponding Indonesian Patent Application No. P00201802499 dated Mar. 2, 2021.

(56) References Cited

OTHER PUBLICATIONS

Office Action (Notice before Allowance) issued in corresponding Israeli Patent Application No. 277277 dated Mar. 25, 2021.
Office Action issued in corresponding Russian Patent Application No. 2021106361 dated Apr. 9, 2021.
Office Action issued in corresponding U.S. Appl. No. 16/985,572 dated May 5, 2021.
Decision to Grant Patent issued in corresponding Ukrainian Patent Application No. a 2017 03141 dated Mar. 26, 2021, with English translation.
Office Action dated Aug. 11, 2016 in Chinese Application No. 2013800154107.
Office Action dated Jul. 4, 2016, in parallel Japanese Patent Application No. 2014-552652, with English translation, 11 pages.
Vetro A., et al., "Antialiasing for 30 Displays", [online], Apr. 27, 2007, Joint Video Team (JVT) of ISO/IEC MPEG & ITU-IT VCEG (ISO/IEC JTC1/SC29/WG1 1 and ITU-T SG16 Q.6), Document: JVT-W060, [Searched an Oct. 1, 2012], Internet <URL: http://wftp3.itu.inUav-arch/jvl-site/2007_04-SanJose/JVT-W060.zip> (See descriptions extending over 7 lines just before Fig.3 of p. 4.).
Luthra, A. (Chair.), "Draft use cases for the scalable enhancement of HEVC (vi)", [online], Nov. 2011, Joint Collaborative Team an Video Coding (JCT-Ve) of ITU-T SG16 WP3 and ISO/IEC JTC1/SC29/WG11, M22558, [Searched an Nov. 8, 2013], Internet <URL: http://phenix.it-sudparis.eu/jcUdoc_end_user/documents/7_Geneva/wg 11/JCTVC-G950-vl. zip> (See descriptions of the last 6 lines of Section 4.1.).
Notification of Reasons for Refusal dated Nov. 6, 2015, from parallel Japanese Patent Application No. 2014-552652, with English translation, 22 pages.
Kameyama, Wataru, et al., "Impress Standard Textbook Series, Textbook on Digital Broadcasting in the era of IPTV", 1st ed., Apr. 1, 2010, Impress R&D col. Lid., p. 122, ISBN: 978-8443-2853-7, 10 pages.
Joshi, R., et al., "AHG19: Modifications to HE transform coefficient coding for transform skip mode", [online], Nov. J5, 2011, Joint Collaborative Team on Video Coding (JCT-Ve) of ITU-T SG16 WP3 and ISO/IEC JTC1/SC29/WG11, Document: JCTVC-G663-rl (version 3), [Searched on Nov. 5, 2015], 8 pages.
Bross, B. et al., WD4: Working Draft 4 of High-Efficiency Video Coding, [online], Aug. 9, 2011, Joint Collaborative Team on Video Coding (JCT-Ve) of ITU-T SG16 WP3 and ISO/IECJTC1/SC29/WG11, Document: JCTVC-F803_d0 version 2), [Searched on Nov. 5, 2015], 16 pages.
Official Communication issued in corresponding International Application PCT /EP2013/051053, dated Apr. 26, 2013.
Nguyen, T. et al., "Reduced-Complexity Entropy Coding of Transform Coefficient Levels Using Truncated Golomb-Rice Codes in Video Compression", 18th IEEE International Conferences on Image Processing, Sep. 11, 2011, pp. 753-756.
Nguyen, T. et al., "Entropy Coding of Syntax Elements Related to Block Structures and Transform Coefficient Levels in HEVC", Proceedings of SPIE, vol. 8499, Oct. 25, 2012, pp. 84990S-1-84990S-II.
Decision to Grant dated Oct. 26, 2017 in Russian Application 2014134039.
Notice of Allowance U.S. Appl. No. 15/621,702 dated Jan. 10, 2018.
Nguyen, T. et al. Reduced-complexity entropy coding of transform coefficient levels using a combination of VLC and PIPE, Joint Collaborative Team on Video Coding (JCT-VC) of ITU-T SG16 WP3 and ISO/IEC JTC1/SC29/WG11, 4th Meeting: Daegu, KR, Jan. 2011, JCTVC-D336, pp. 1-8.
Hisao Sasai and Takahiro Nishi, Non-CE 11: Modified Context Derivation for last coefficient flag, Joint Collaborative Team on Video Coding {JCT-Ve) of ITU-T SG16 WP3 and ISO/IEC JTC1/SC29/WG11, 7th Meeting: Geneva, CH, Nov. 2011, JCTVC-G520r2, pp. 1-5.
Jian Lou, Umin Wang and Xue Fang, On coeff_abs_level_minus3 coding, Joint Collaborative Team on Video Coding (JCT-Ve) of ITU-T SG16 WP3 and ISO/IEC JTC1/SC29/WG11, 7th Meeting: Geneva, CH, Nov. 2011, JCTVC-G0700-r5, pp. 1-13.
T_ Nguyen, D. Marpe and T. Wiegand, Non-Cell: Proposed Cleanup for Transform Coefficient Coding, Joint Collaborative Team on Video Coding (JCT-Ve) of ITU-T SG16 WP3 and ISO/IEC JTC1/SC29/WG11, 8th Meeting: San Jose, CA, USA, Jan. 2012, JCTVC-H0228, pp. 1-6.
Notification of Reasons for Refusal dated Feb. 27, 2018 JP 2017-083843.
Office Action issued in corresponding Australian Patent Application 2022204497 dated May 9, 2023.
Office Action issued in corresponding Russian Patent Application 2022127073 dated Jul. 6, 2023, with English translation.
Search Report issued in corresponding Russian Patent Application 2022127073 dated Jul. 6, 2023, with English translation.

* cited by examiner

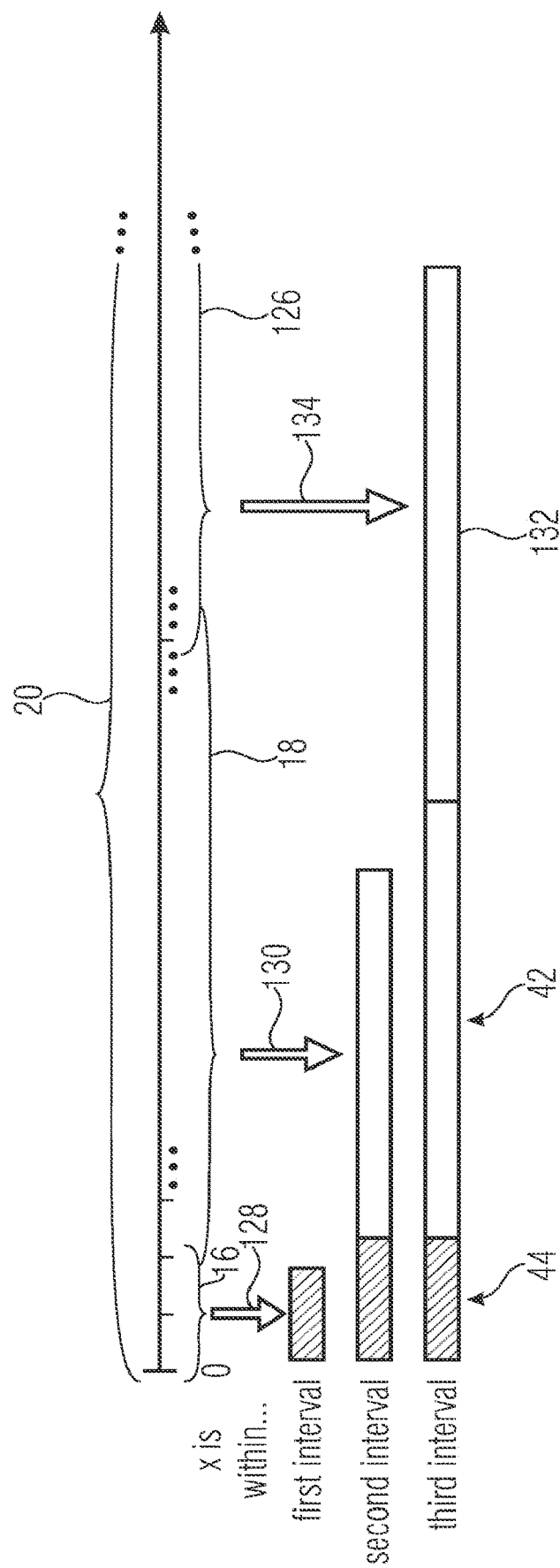

TRANSFORM COEFFICIENT CODING

CROSS REFERENCE TO RELATED APPLICATIONS

The present application is a continuation of U.S. patent application Ser. No. 17/136,716 filed Dec. 29, 2020, which is a continuation of U.S. patent application Ser. No. 16/985,572 filed Aug. 5, 2020, which is a continuation of U.S. patent application Ser. No. 16/745,696 filed Jan. 17, 2020, now U.S. Pat. No. 10/757,447, which is a continuation of U.S. patent application Ser. No. 16/522,884 filed Jul. 26, 2019, now U.S. Pat. No. 10,582,219, which is a continuation of U.S. patent application Ser. No. 16/285,761 filed Feb. 26, 2019, now U.S. Pat. No. 10,462,487, which is a continuation of U.S. patent application Ser. No. 15/948,085 filed Apr. 9, 2018, now U.S. Pat. No. 10,271,068, which is a continuation of U.S. patent application Ser. No. 15/621,702 filed Jun. 13, 2017, now U.S. Pat. No. 10,045,049, which is a continuation of U.S. patent application Ser. No. 14/335,439 filed Jul. 18, 2014, now U.S. patent application Ser. No. 9,712,844, which is a continuation of International Application No. PCT/EP2013/051053, filed Jan. 21, 2013, and additionally claims priority from U.S. application Ser. No. 61/588,846, filed Jan. 20, 2012, all of which are incorporated herein by reference in their entireties.

BACKGROUND OF THE INVENTION

The present invention is concerned with transform coefficient coding such as transform coefficients of a transform coefficient block of a picture.

In block-based image and/or video codecs, a picture or frame is coded in units of blocks. Among same, transform-based codecs subject blocks of the picture or frame to a transformation so as to obtain transform coefficient blocks. For example, the picture or frame may be predictively coded with a prediction residual being transform coded in units of blocks and then coding the resulting transform coefficient levels of the transform coefficients of these transform blocks using entropy coding.

In order to increase the efficiency of entropy coding, contexts are used in order to precisely estimate the probability of the symbols of the transform coefficient levels to be coded. However, in the recent years, the demands imposed onto picture and/or image codecs has increased. In addition to the luma and chroma components, codecs sometimes have to convey depth maps, transparity values and so forth. Moreover, the transform block sizes are variable within an increasingly large interval. Due to these varieties, codecs have an increasing number of different contexts with different functions for determining the context from already coded transform coefficients.

A different possibility of achieving high compression rates at a more moderate complexity, is adjusting a symbolization scheme to the coefficients' statistics as precise as possible. However, in order to perform this adaptation closely to the actual statistics, it is also mandatory to take various factors into account thereby necessitating a huge amount of differing symbolization schemes.

Accordingly, there is a need for keeping the complexity of transform coefficient coding low while nevertheless maintaining the possibility of achieving a high coding efficiency.

SUMMARY

According to an embodiment, an apparatus for decoding a plurality of transform coefficients having transform coefficient levels from a data stream may have: a context adaptive entropy decoder configured to, for a current transform coefficient, entropy decode a first set of one or more symbols from the data stream; a desymbolizer configured to map the first set of one or more symbols onto a transform coefficient level within a first level interval in accordance with a first symbolization scheme; an extractor configured to, if the transform coefficient level onto which the first set of one or more symbols is mapped in accordance with the first symbolization scheme is a maximum level of the first level interval, extract a second set of symbols from the data stream, wherein the desymbolizer is configured to map the second set of symbols onto a position within a second level interval in accordance with a second symbolization scheme which is parameterizable in accordance with a symbolization parameter, wherein the context adaptive entropy decoder is configured to, in entropy decoding at least one predetermined symbol of the first set of one or more symbols from the data stream, use a context depending, via a function parameterizable via a function parameter, with the function parameter set to a first setting, on previously decoded transform coefficients, and wherein the apparatus further includes a symbolization parameter determinator configured to, if the transform coefficient level onto which the first set of one or more symbols is mapped in accordance with the first symbolization scheme is a maximum level of the first level interval, determine the symbolization parameter depending, via the function with the function parameter set to a second setting, on the previously decoded transform coefficients.

Another embodiment may have a picture decoder including an inventive apparatus, wherein the picture decoder is configured to, in decoding a picture, retransform blocks of the picture from transform coefficient blocks, wherein the apparatus is configured to sequentially decode a plurality of transform coefficients of the transform coefficient blocks, transform coefficient block by transform coefficient block, with using the function for transform coefficient blocks of different sizes, for transform coefficient blocks of different sizes, and/or for transform coefficient blocks of different information component type.

According to another embodiment, an apparatus for coding a plurality of transform coefficients having transform coefficient levels into a data stream may have: a symbolizer configured to map a current transform coefficient onto a first set of one or more symbols in accordance with a first symbolization scheme, if the current transform coefficient's transform coefficient level is within a first level interval, and if the current transform coefficient's transform coefficient level is within a second level interval, onto a combination of a second set of symbols onto which a maximum level of the first level interval is mapped in accordance with the first symbolization scheme, and a third set of symbols depending on a position of the current transform coefficient's transform coefficient level within the second level interval, in accordance with a second symbolization scheme which is parameterizable in accordance with a symbolization parameter; a context adaptive entropy encoder configured to, if the current transform coefficient's transform coefficient level is within the first level interval, entropy encode the first set of one or more symbols into the data stream, and, if the current transform coefficient's transform coefficient level is within the second level interval, entropy encode the second set of one or more symbols into the data stream, wherein the context adaptive entropy encoder is configured to, in entropy encoding at least one predetermined symbol of the second set of one or more symbols into the data stream, use a context depending, via a function parameterizable via a function parameter, with the function parameter set to a first setting, on previously coded transform coefficient's transform coefficient level is within the second level interval, determine the symbolization parameter for the mapping onto the third set of symbols depending, via the function with the function parameter set to a second setting, on the previously coded transform coefficient level is within the second level interval, insert the third set of symbols into the data stream.

Another embodiment may have a picture encoder including an inventive apparatus, wherein the picture encoder is configured to, in encoding a picture, transform blocks of the picture into transform coefficient blocks, wherein the apparatus is configured to code a plurality of transform coefficients of the transform coefficient blocks, transform coefficient block by transform coefficient block, with using the function for blocks of different sizes.

According to another embodiment, an apparatus for decoding a plurality of transform coefficients of different transform blocks, each having a transform coefficient level, from a data stream, may have: an extractor configured to extract a set of symbols from the data stream for a current transform coefficient; a desymbolizer configured to map the set of symbols onto a transform coefficient level for the current transform coefficient in accordance with a symbolization scheme which is parameterizable in accordance with a symbolization parameter, and a symbolization parameter determinator configured to determine the symbolization parameter for the current transform coefficient depending, via a function parameterizable via a function parameter, on previously processes transform coefficients, wherein the extractor, the symbolizer and the symbolization parameter determinator are configured to sequentially process the transform coefficients of the different transform blocks, wherein the function parameter varies depending on a size of the current transform coefficient's transform block, an information component type of the current transform coefficient's transform block and/or a frequency portion the current transform coefficient is located within the transform block.

According to another embodiment, an apparatus for coding a plurality of transform coefficients of different transform blocks, each having a transform coefficient level, into a data stream, may have: a symbolizer configured to map a transform coefficient level for a current transform coefficient in accordance with a symbolization scheme which is parameterizable in accordance with a symbolization parameter, onto a set of symbols; an inserter configured to insert the set of symbols for the current transform coefficient into the data stream; and a symbolization parameter determinator configured to determine the symbolization parameter for the current transform coefficient depending, via a function parameterizable via a function parameter, on previously processes transform coefficients, wherein the inserter, the symbolizer and the symbolization parameter determinator are configured to sequentially process the transform coefficients of the different transform blocks, wherein the function parameter varies depending on a size of the current transform coefficient's transform block, an information component type or the current transform coefficient's transform block and/or a frequency portion the current transform coefficient is located within the transform block.

According to another embodiment, a method for decoding a plurality of transform coefficients having transform coefficient levels from a data stream may have the steps of: for a current transform coefficient, entropy decoding a first set of one or more symbols from the data stream; desymbolization mapping the first set of one or more symbols onto a transform coefficient level within a first level interval in accordance with a first symbolization scheme; if the transform coefficient level onto which the first set of one or more symbols is mapped in accordance with the first symbolization scheme is a maximum level of the first level interval, extract a second set of symbols from the data stream, wherein the desymbolization mapping includes mapping the second set of symbols onto a position within a second level interval in accordance with a second symbolization scheme which is parameterizable in accordance with a symbolization parameter, the entropy decoding involves entropy decoding at least one predetermined symbol of the first set of one or more symbols from the data stream with using a context depending, via a function parameterizable via a function parameter, with the function parameter set to a first setting, on previously decoded transform coefficients, and may further have the step of: if the transform coefficient level onto which the first set of one or more symbols is mapped in accordance with the first symbolization scheme is a maximum level of the first level interval, determining the symbolization parameter depending, via the function with the function parameter set to a second setting, on the previously decoded transform coefficients.

According to another embodiment, a method for coding a plurality of transform coefficients having transform coefficient levels into a data stream may have the steps of: symbolization mapping a current transform coefficient onto a first set of one or more symbols in accordance with a first symbolization scheme, if the current transform coefficient's transform coefficient level is within a first level interval, and if the current transform coefficient's transform coefficient level is within a second level interval, onto a combination of a second set of symbols onto which a maximum level of the first level interval is mapped in accordance with the first symbolization scheme, and a third set of symbols depending on a position of the current transform coefficient's transform coefficient level within the second level interval, in accordance with a second symbolization scheme which is parameterizable in accordance with a symbolization parameter; context adaptive entropy encoding including, if the current transform coefficient's transform coefficient level is within the first level interval, entropy encoding the first set of one or more symbols into the data stream, and, if the current transform coefficient's transform coefficient level is within the second level interval, entropy encoding the second set of one or more symbols into the data stream, wherein the context adaptive entropy encoding involves, in entropy encoding at least one predetermined symbol of the second set of one or more symbols into the data stream, using a context depending, via a function parameterizable via a function parameter, with the function parameter set to a first setting, on previously coded transform coefficients; and if the current transform coefficient's transform coefficient level is within the second level interval, determining the symbolization parameter for the mapping onto the third set of symbols depending, via the function with the function parameter set to a second setting, on the previously coded transform coefficients; and if the current transform coefficient's transform coefficient level is within the second level interval, inserting the third set of symbols into the data stream.

According to another embodiment, a method for decoding a plurality of transform coefficients of different transform blocks, each having a transform coefficient level, from a data stream, may have the steps of: extracting a set of symbols from the data stream for a current transform coefficient; desymbolization mapping the set of symbols onto a transform coefficient level for the current transform coefficient in accordance with a symbolization scheme which is parameterizable in accordance with a symbolization parameter, and determining the symbolization parameter for the current transform coefficient depending, via a function parameterizable via a function parameter, on previously processed transform coefficients, wherein the extraction, the symbolization mapping and the determination are sequentially performed on the transform coefficients of the different transform blocks, wherein the function parameter varies depending on a size of the current transform coefficient's transform block, an information component type of the current transform coefficient's transform block and/or a frequency portion the current transform coefficient is located within the transform block According to another embodiment, a method for coding a plurality of transform coefficients of different transform blocks, each having a transform coefficient level, into a data stream, may have the steps of: symbolization mapping a transform coefficient level for a current transform coefficient in accordance with a symbolization scheme which is parameterizable in accordance with a symbolization parameter, onto a set of symbols; inserting the set of symbols for the current transform coefficient into the data stream; and determining the symbolization parameter for the current transform coefficient depending, via a function parameterizable via a function parameter, on previously processed transform coefficients, wherein the insertion, the symbolization mapping and the determination are sequentially performed on the transform coefficients of the different transform blocks, wherein the function parameter varies depending on a size of the current transform coefficient's transform block, an information component type of the current transform coefficient's transform block and/or a frequency portion the current transform coefficient is located within the transform block.

Another embodiment may have a computer program having a program code for performing, when running on a computer, an inventive method In accordance with an aspect of the present invention, an apparatus for coding a plurality of transform coefficients having transform coefficient levels into a stream, comprises a symbolizer configured to map a current transform coefficient onto a first set of one or more symbols in accordance with a first symbolization scheme, with the current transform coefficient's transform coefficient level is within a first level interval, and if the current transform coefficient's transform coefficient level is within a second level interval, onto a combination of a second set of symbols onto which a maximum level of the first level interval is mapped in accordance with the first symbolization scheme, and a third set of symbols depending on a position of the current transform coefficient's transform coefficient level within the second level interval, in accordance with a second symbolization scheme which is parameterizable in accordance with a symbolization parameter. Further, the apparatus comprises a context adaptive entropy encoder configured to, if the current transform coefficient's transform coefficient level is within the first level interval, entropy encode the first set of one or more symbols into the data stream, and, if the current transform coefficient's transform coefficient level is within the second level interval, entropy encode the second set of one or more symbols into the data stream, wherein the context adaptive entropy encoder is configured to, in entropy encoding at least one predetermined symbol of the second set of one of more symbols into the data stream, use a context depending, via a function parameterizable via a function parameter, with a function parameter set to a first setting, on previously coded transform coefficient. Further, the apparatus comprises a symbolization parameter determinator configured to, if the current transform coefficient's transform coefficient level is within the second level interval, determine the symbolization parameter for the mapping onto the third set of symbols depending, via the function with the function parameter set to a second setting, on the previously coded transform coefficients. An inserter is configured to, if the current transform coefficient's transform coefficient level is within the second level interval, insert the third set of symbols into the data stream.

According to another aspect of the present invention, an apparatus for coding a plurality of transform coefficients of different transform blocks, each having a transform coefficient level, into a data stream, comprises a symbolizer configured to map a transform coefficient level for a current transform coefficient in accordance with a symbolization scheme which is parameterizable in accordance with a symbolization parameter, onto a set of symbols; an inserter configured to insert the set of symbols for the current transform coefficient into the data stream; and a symbolization parameter determinator configured to determine the symbolization parameter for the current transform coefficient depending, via a function parameterizable via a function parameter, on previously processed transform coefficients, wherein the inserter, the desymbolizer and the symbolization parameter determinator are configured to sequentially process the transform coefficients of the different transform blocks, wherein the function parameter varies depending on a size of the current transform coefficient's transform block, an information component type of the current transform coefficient's transform block and/or a frequency portion the current transform coefficient is located within the transform block.

An idea of the present invention is to use the same function for the dependency of the context and the dependency of the symbolization parameter on previously coded/decoded transform coefficients. Using the same function—with varying function parameter—may even be used with respect to different transform block sizes and/or frequency portions of the transform blocks in case of the transform coefficients being spatially arranged in transform blocks. A further variant of this idea is to use the same function for the dependency of a symbolization parameter on previously coded/decoded transform coefficients for different sizes of the current transform coefficient's transform block, different information component types of the current transform coefficient's transform block and/or different frequency portions the current transform coefficient is located within the transform block

BRIEF DESCRIPTION OF THE DRAWINGS

Embodiments of the present invention will be detailed subsequently referring to the appended drawings, in which:

FIGS. 11a and 11b shows schematic diagrams of symbolization concepts for transform coefficient levels combining two or three different schemes within partial intervals of the whole interval range;

DETAILED DESCRIPTION OF THE INVENTION

With respect to the description below, it is noted that the same reference sign is used in these figures for elements occurring in more than one of these figures. Accordingly, the description of such an element with respect to one figure shall equally apply to the description of another figure in witch this element occurs.

Moreover, the description brought forward below preliminarily assumes the transform coefficients to be coded as being two-dimensionally arranged so as to form a transform block such as a transform block of a picture. However, the present application is not restricted to image and/or video coding. Rather, the transform coefficients to be coded could, alternatively, be transform coefficients of a one-dimensional transform such as used, for example, in audio coding or the like.

In order to explain the problems that the embodiments described further below face, the way the embodiments further described below overcome these problems, reference is preliminarily made to FIGS. 1 to 3, which show an example of transform coefficients of a transform block and their general way of entropy coding, which is then improved by the subsequently explained embodiments.

Figure 1:
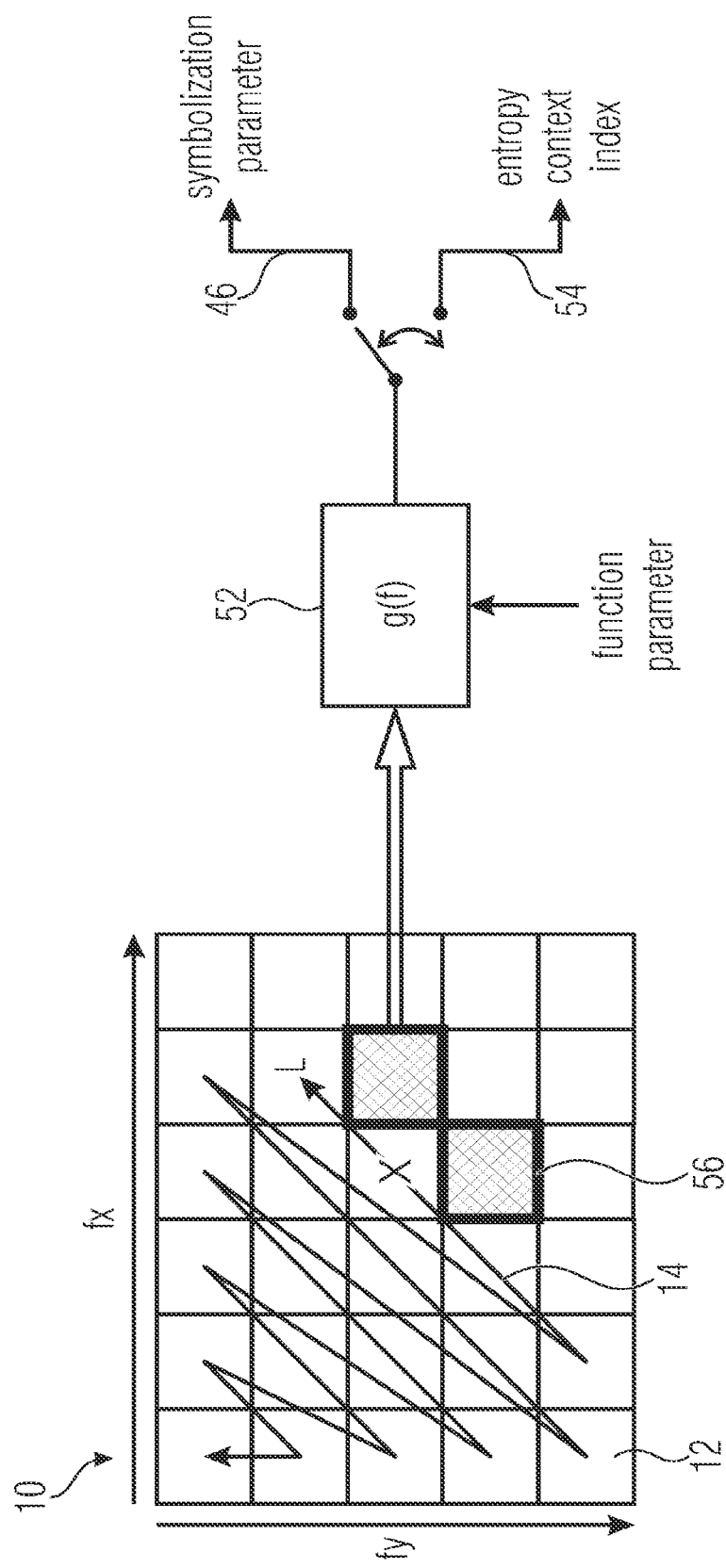
FIG. 1 shows a schematic diagram of a transform coefficient block comprising transform coefficients to be coded and illustrates the co-use of a parameterizable function for context selection and symbolization parameter determination in accordance with an embodiment of the preset invention.

FIG. 1 exemplarily shows a block 10 of transform coefficients 12. In the present embodiment, the transform coefficients are two-dimensionally arranged. In particular, same are exemplarily shown as being regularly arranged in columns and rows although another two-dimensional arrangement is also possible. The transform which led to the transform coefficients 12 or transform block 10 may be a DCT or some other transform which decomposes a (transform) block of a picture, for example, or some other block of spatially arranged values into components of different spatial frequency. In the present example of FIG. 1, the transform coefficients 12 are two-dimensionally arranged in columns i and rows j so as to correspond to frequency pairs $(f_x(i), f_y(j))$ of frequencies $f_x(i)$, $f_y(j)$ measured along different spatial directions x,y such as directions perpendicular to each other, where $f_{x/y}(j) < f_{x/y}(i+1)$ and (i,j) is the position of the respective coefficient in transform block 10.

Often the transform coefficients 12 corresponding to lower frequencies have higher transform coefficient level compared to transform coefficients corresponding to higher frequencies. Accordingly, often many of the transform coefficients near the highest frequency component of the transform block 10 are quantized to zero and may not have to be coded. Rather, a scan order 14 may be defined among the transform coefficients 12 which one-dimensionally arranges the two-dimensionally arranged transform coefficients 12 (i,j) into a sequence of coefficients at an order, i.e. (i,j) k, so that it is likely that the transform coefficient levels have a tendency of monotonically decreasing along this order, i.e. it is likely that coefficient level of coefficient k is greater than coefficient level of coefficient k+1.

For example, a zigzag or a raster scan may be defined among the transform coefficients 12. According to the scan, the block 10 may be scanned in diagonals from, for example, the DC component transform coefficient (upper left-hand coefficient) to the highest frequency transform coefficient (lower right-hand coefficient) or vice versa. Alternatively, a row-wise or column-wise scan of the transform coefficients between the just mentioned extreme component transform coefficients may be used.

As described further below, in coding the transform block the position of the last non-zero transform coefficient L in scan order 14 may be coded into the data stream first, with then merely coding the transform coefficients from the DC transform coefficient along scan path 14 to the last non-zero transform coefficient—optionally in that direction or in counter direction.

The transform coefficients 12 have transform coefficient levels which may be signed or unsigned. For example, the transform coefficients 12 may have been obtained by the afore-mentioned transform with subsequent quantization onto a set of possible quantization values each being associated with a respective transform coefficient level. The quantization function used to quantize the transform coefficients, i.e. map the transform coefficients onto the transform coefficient levels, may be linear or non-linear. In other words, each transform coefficient 12 has a transform coefficient level out of an interval of possible levels. FIG. 2, for example, shows an example where the transform coefficient levels x are defined within a range of levels $[0, 2^{N-1}]$. In accordance with an alternative embodiment, there may be no upper bound of the interval range. Moreover, FIG. 2 illustrates only positive transform coefficient levels although same may also be signed. Regarding the signs of the transform coefficients 12 and their coding, it should be noted that different possibilities exist with respect to all of the embodiments outlined below in order to code these signs, and all of these possibilities shall be within the scope of these embodiments. With regard to FIG. 2, this means that there may also be no lower bound of the range interval of the transform coefficient levels.

In any case, in order to code the transform coefficient levels of the transform coefficients 12, different symbolization schemes are used in order to cover different portions or intervals 16, 18 of the range interval 20. To be more precise, transform coefficient levels within a first level interval 16, except for the ones equal to a maximum level of the first level interval 16, may simply be symbolized onto a set of one or more symbols in accordance with a first symbolization scheme. Transform coefficient levels, however, lying within the second level interval 18, are mapped onto a combination of symbol sets of the first and second symbolization schemes. As will be noted later, third and further intervals may follow the second interval accordingly.

Figure 2:
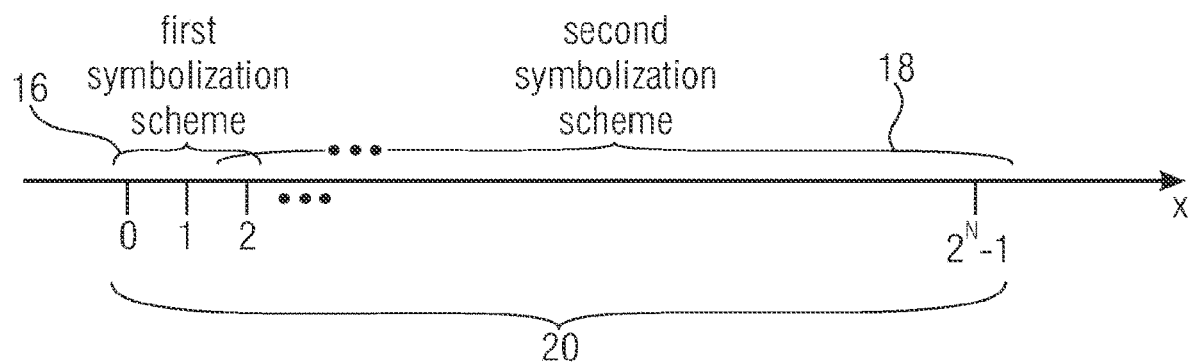
FIG. 2 shows a schematic diagram of symbolization concept for transform coefficient levels using two different schemes within two level intervals.

As shown in FIG. 2, the second level interval 18 lies above the first level interval 16 but overlaps with the latter at the maximum level of the first level interval 16, which is 2 in the example of FIG. 2. For transform coefficient levels lying within the second level interval 18, the respective level is mapped onto a combination of the first symbol set corresponding to the first level interval's maximum level in accordance with the first symbolization scheme, and a second symbol set depending on a position of the transform coefficient level within the second level interval 18 in accordance with the second symbolization scheme.

In other words, the first symbolization scheme 16 maps the levels covered by the first level interval 16 onto a set of first symbol sequences. Please note that the length of the symbol sequences within the set of symbol sequences of the first symbolization scheme may even be merely one binary symbol in case of a binary alphabet and in case of the first level interval 16 merely covering two transform coefficient levels such as 0 and 1. In accordance with an embodiment of the present application, the first symbolization scheme is a truncated unary binarization of levels in interval 16. In case of a binary alphabet, the symbols may be called bins.

As will be described in more detail below, the second symbolization scheme maps the levels within the second level interval 18 onto a set of second symbol sequences of varying length wherein the second symbolization scheme is parameterizable in accordance with a symbolization parameter. The second symbolization scheme may map the levels within interval 18, i.e. x—the maximum level of the first interval, onto a Rice code having a Rice parameter.

In particular, the second symbolization scheme 18 may be configured such that the symbolization parameter varies a rate at which a length of the second scheme's symbol sequences increases from the lower bound of the second level interval 18 to an upper bound thereof. Obviously, an increased length of the symbol sequences consumes more data rate within the data stream into which the transform coefficients are to be coded. Generally, it is advantageous if the length of the symbol sequence onto which a certain level is mapped correlates with the actual probability at which the transform coefficient level to be currently coded assumes the respective level. Naturally, the latter statement is also valid for the levels outside the second level interval 18 within the first level interval 16 or for the first symbolization scheme in general.

Figure 3:
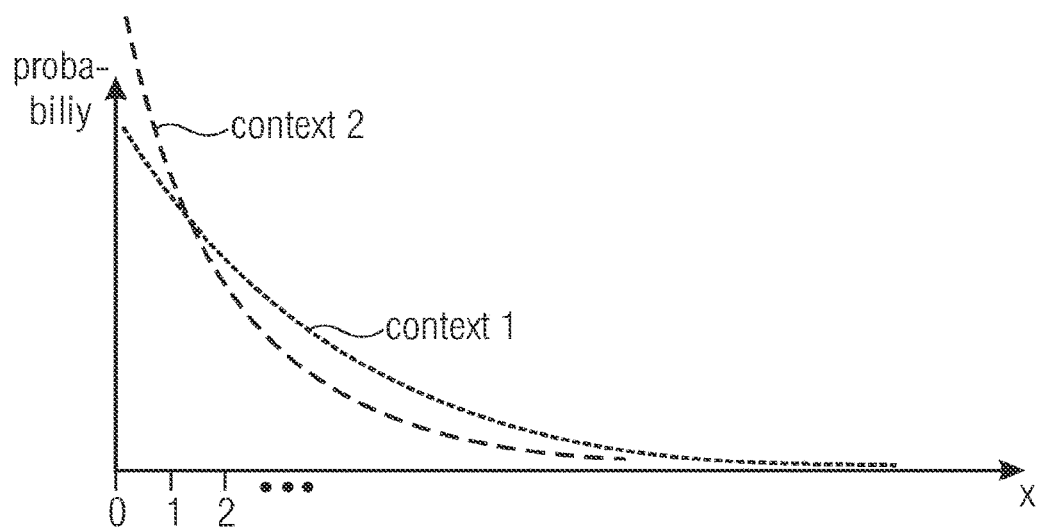
FIG. 3 shows a schematic graph of two appearance probability curves defined over possible transform coefficient levels for two different contexts.

In particular, as shown in FIG. 3, transform coefficients typically show a certain statistics or probability of occurrence of certain transform coefficient levels. FIG. 3 shows a graph associating to each possible transform coefficient level x a probability at which the respective transform coefficient level is actually assumed by a transform coefficient in question. To be more precise, FIG. 3 shows two such associations or probability curves, namely for two coefficients of different contexts. That is, FIG. 3 assumes transform coefficients to be differentiated according to their contexts such as determined by the transform coefficient values of neighboring transform coefficients. Depending on the context, FIG. 3 shows that the probability curve which associates a probability value with each transform coefficient level may depend on the context of the transform coefficient in question.

In accordance with the embodiments described below, the symbols of the symbol sequences of the first symbolization scheme 16 are entropy coded in a context adaptive way. That is, a context is associated with the symbols, and the alphabet probability distribution associated with the selected context is used tor entropy coding the respective symbol. The symbols of the symbol sequences of the second symbolization scheme are inserted into the data stream directly or using a fixed alphabet probability distribution such an equal probability distribution according to which all members of the alphabet are equally probable.

Contexts used entropy coding the symbols of the first symbolization scheme have to be selected appropriately so as to allow for a good adaptation of the estimated alphabet probability distribution to the actual alphabet statistics. That is, the entropy coding scheme may be configured to update a current estimate of the context's alphabet probability distribution whenever a symbol having this context is encoded/decoded, thereby approximating the actual alphabet statistics. The approximation is faster if the contexts are chosen appropriately, that is fine enough, but not with too many different contexts so as to avoid a too infrequent association of symbols with certain contexts.

Likewise, the symbolization parameter for a coefficient should be chosen dependent on the previously coded/decoded coefficients so to approximate the actual alphabet statistics as close as possible. Too fine diversification is not a critical issue here, because the symbolization parameter is directly determined from the previously coded/decoded coefficients, but determination should closely correspond to the correlation of the dependency of the probability curve within the second interval 18 on the previously coded/decoded coefficients.

As will be described in more detail below, the embodiments for coding transform coefficients further described below are advantageous in that a common function is used in order to achieve the context adaptivity and the symbolization parameter determination. Choosing the correct context is, as outlined above, important in order to achieve a high coding efficiency or compression rate, and the same applies with respect to the symbolization parameter. The embodiments described below allow for achieving this aim by keeping the overhead for instantiating the dependency on previously coded/decoded coefficients low. In particular, the inventors of the present application found a way of finding a good compromise between realizing efficient dependency on previously coded/decoded coefficients on the one hand and reducing the number of proprietary logic for instantiating the individual context dependencies on the other hand.

Figure 4:
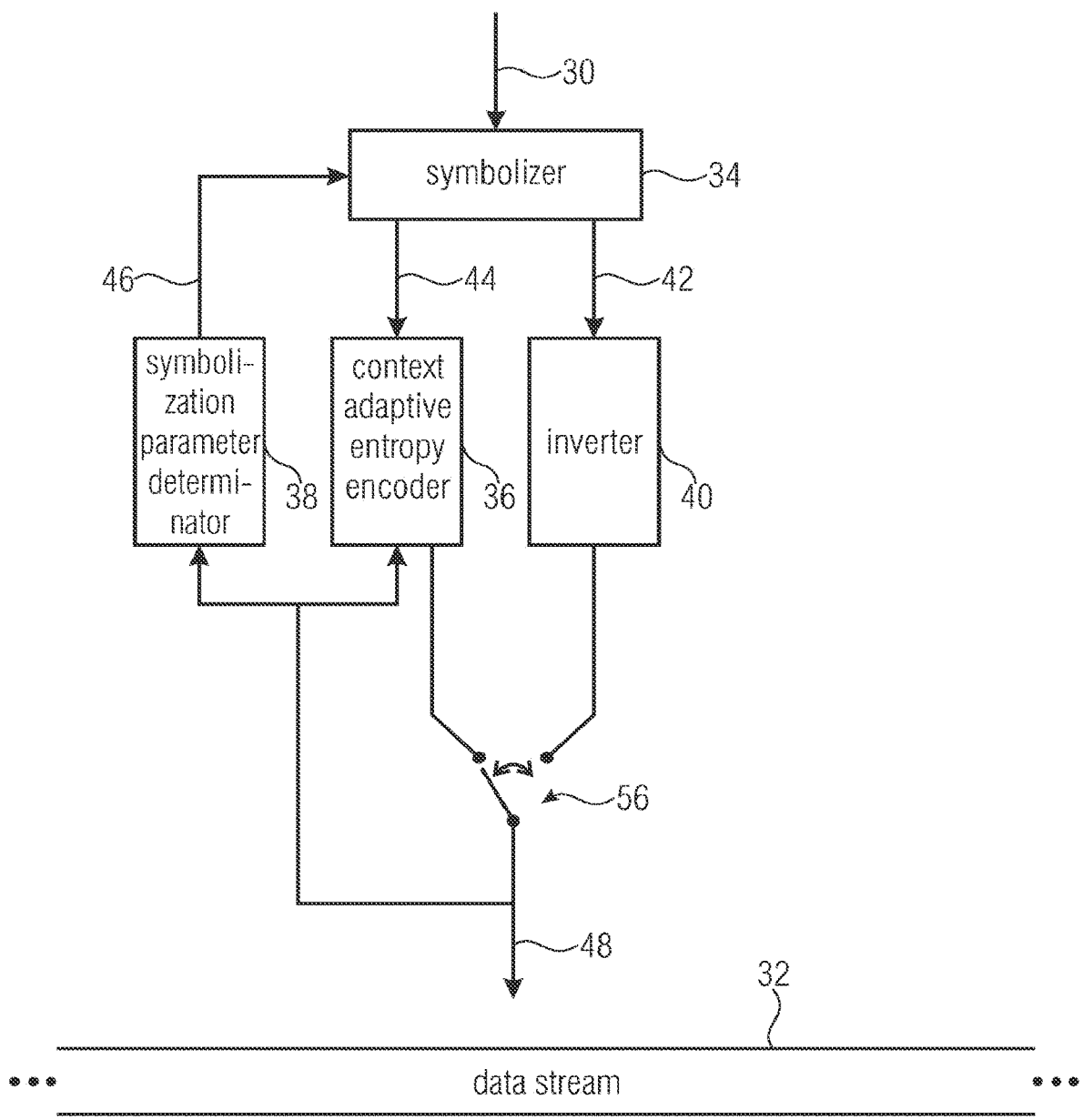
FIG. 4 shows a block diagram of an apparatus for coding a plurality of transform coefficients in accordance with an embodiment.

FIG. 4 shows an apparatus for coding a plurality of transform coefficients having transform coefficient levels into a data stream in accordance with an embodiment of the present invention. It is noted that in the following description, the symbol alphabet is often assumed to be a binary alphabet although this assumption is, as outlined above, not critical for the present invention and accordingly, all of these explanations shall be interpreted as being also illustrative for an extension onto other symbol alphabets.

The apparatus of FIG. 4 for coding a plurality of transform coefficients entering at an input 30 into a data stream 32. The apparatus comprises a symbolizer 34, a context adaptive entropy encoder 36, a symbolization parameter determinator 38 and an inserter 40.

The symbolizer 34 has its input connected to input 30 and is configured to map a current transform coefficient currently entering its input onto symbols in the way described above with respect to FIG. 2. That is, the symbolizer 34 is configured to map a current transform coefficient onto a first set of one or more symbols in accordance with a first symbolization scheme, if the current transform coefficient's transform coefficient level x is within the first level interval 16, and, if the current transform coefficient's transform coefficient level is within the second level interval 18, onto a combination of a second set of symbols onto which the maximum level of the first interval 16 is mapped in accordance with a first symbolization scheme, and a third set of symbols depending on a position of the current transform coefficient's transform coefficient level within the second level interval 18, in accordance with a second symbolization scheme. In other words, the symbolizer 34 is configured to map a current transform coefficient onto a first symbol sequence of the first symbolization scheme in case of the current transform coefficient's transform coefficient level being within the first level interval 16 but outside the second level interval, and onto a combination of the first symbolization scheme's symbol sequence for the maximum level of the first interval 16 and a symbol sequence of the second symbolization scheme in case of the current transform coefficient's transform coefficient level being within the second level interval.

The symbolizer 34 has two outputs, namely one for symbol sequences of the first symbolization scheme, and another for the symbol sequences of the second symbolization. scheme. The inserter 40 has an input for receiving the second symbolization scheme's symbol sequences 42 and the context adaptive entropy encoder 36 has an input for receiving the first symbolization scheme's symbol sequences 44. Further, the symbolizer 34 has a parameter input for receiving the symbolization parameter 46 from an output of symbolization parameter determinator 38.

The context adaptive entropy encoder 36 is configured to entropy encode the symbol of the first symbol sequences 44 into the data stream 32. The inserter 40 is configured to insert the symbol sequences 42 into data stream 32.

Generally speaking, both entropy encoder 36 and inserter 40 sequentially scan the transform coefficients. Obviously, inserter 40 merely operates for transform coefficients, the transform coefficient level of which lies within the second level interval 18. However, as will be described in more detail below, there are different possibilities for defining the order between the operation of the entropy encoder 36 and the inserter 40. In accordance with a first embodiment, the coding apparatus of FIG. 4 is configured to scan the transform coefficients in one single scan so that inserter 40 inserts the symbol sequence 42 of a transform coefficient into the data stream 32 subsequent to the entropy encoder's entropy encoding of the first symbol sequence 44 relating to the same transform coefficient into the data stream 32 and prior to the entropy encoder's entropy encoding the symbol sequence 44 relating to the next transform coefficient in line into the data stream 32.

In accordance with an alternative embodiment, the apparatus uses two scans, wherein within the first scan the context adaptive entropy encoder 36 sequentially encodes the symbol sequences 44 into the data stream 32 for each transform coefficient with inserter 40 then inserting the symbol sequences 42 for those transform coefficients the transform coefficient level of which lies within the second level interval 18. There could even be more sophisticated schemes according to which, for example, the context adaptive entropy encoder 36 uses several scans in order to encode the individual symbols of the first symbol sequences 44 into the data stream 32 such as the first symbol or bin in a first scan, followed by a second symbol or bin of the sequences 44 in a second scan and so forth.

As already indicated above, the context adaptive entropy encoder 36 is configured to entropy encode at least one predetermined symbol of the symbol sequences 44 into the data stream 32 in a context adaptive way. For example, the context adaptivity could be used for all the symbols of the symbols sequences 44. Alternatively, context adaptive entropy encoder 36 may restrict the context adaptivity to the symbols at the first position and the symbol sequences of the first symbolization scheme only, or the first and second, or the first to third positions and so forth.

As described above, for context adaptivity, encoder 36 manages contexts by storing and updating an alphabet probability distribution estimate for each context. Each time a symbol of a certain context is encoded, the currently stored alphabet probability distribution estimate is updated using the actual value of this symbol thereby approximating the symbols' actual alphabet statistics of that context.

Likewise, symbolization parameter determinator 38 is configured to determine the symbolization parameter 46 for the second symbolization scheme and its symbol sequences 42 depending previously coded transform coefficients.

To be more precise, the context adaptive entropy encoder 36 is configured such that same uses, or select, for the current transform coefficient a context depending, via a function parameterizable via a function parameter, and with the function parameter set to a first setting, on previously coded transform coefficients, while the symbol parameter determinator 38 is configured to determine the symbolization parameter 46 depending, via the same function, and with the function parameter set to second setting, on the previously coded transform coefficients. The settings may differ, but nevertheless, as symbolization parameter determinator 38 and context adaptive entropy encoder 36 use the same function, logic overhead may be reduced. Merely the function parameter may differ between the context selection of the entropy encoder 36 on the one hand and the symbolization parameter determination of the symbolization parameter determinator 38 on the other hand.

As far as the dependency on the previously coded transform coefficients is concerned, it should be noted that this dependency is restricted to the extent to which these previously coded transform coefficients have already been coded into data stream 32. Imagine, for example, that such a previously encoded transform coefficient lies within the second level interval 18, but the symbol sequence 42 thereof has not yet been inserted into data stream 32. In that case, symbolization parameter determinator 38 and context adaptive entropy encoder 36 merely know from the first symbol sequence 44 of that previously coded transform coefficient that same lies within the second level interval 18. In that case, the maximum level of the first level interval 16 may serve as a representative for this previously coded transform coefficient Insofar, the dependency "on the previously coded transform coefficients"shall be understood in a broad way so as to encompass a dependency on "information on other transform coefficients previously encoded/inserted into the data stream 32". Further, transform coefficients lying "beyond" the last non-zero coefficient L position may be inferred to be zero.

In order to finalize the description of FIG. 4, the outputs of entropy encoder 36 and inserter 40 are shown to be connected to a common output 48 of the apparatus via a switch 50, with the same connectivity existing between inputs for previously inserted/coded information of symbolization parameter determinator 38 and context adaptive entropy encoder 36 on the one hand and the outputs of entropy encoder 36 and inserter 40 on the other hand. Switch 50 connects output 48 with either one of the outputs of entropy encoder 36 and inserter 40 in the order mentioned above with respect to the various possibilities of using one, two or more scans for coding the transform coefficients.

In order to explain the common use of the parameterizable function with respect to context adaptive entropy encoder 36 and symbolization parameter determinator 38 in more specific terms, reference is made to FIG. 1. The function which is co-used by entropy encoder 36 and symbolization parameter determinator 38 is indicated at 52 in FIG. 1, namely f(f(x)). The function is applied to a set of previously coded transform coefficients which may, as explained above, be defined to encompass those previously coded coefficients having a certain spatial relationship relative to the current coefficient. Specific embodiments for this function will be outlined in more detail below. Generally speaking, f is function which combines the set of previously coded coefficient levels into a scalar, wherein g is function which checks as to which interval the scalar lies in. In other words, the function g(f(x)) is applied to a set x of transform coefficients previously coded. In FIG. 1, the transform coefficient 12 indicated by a small cross denotes, for example, the current transform coefficient, and the hatched transform coefficients 12 indicate the set x of transform coefficients to which function 52 is applied in order to obtain a symbolization parameter 46 and an entropy context index 54 indexing the context for the current transform coefficient x. As illustrated in FIG 1., a local template, defining a relative spatial arrangement around the current transform coefficient may be used in order to determine the set x of relevant previously coded transform coefficients out of all previously coded transform coefficients. As can be seen in FIG. 1, the template 56 may encompass the immediately neighboring transform coefficient below and to the right of the current transform coefficient. By choosing the template like this, the symbol sequences 42 and 44 of transform coefficients on one diagonal of the scan 140 may be coded in parallel since none of the transform coefficients on a diagonal falls into the template 56 of another transform coefficient in the same diagonal. Naturally, similar templates may be found for row- and column-wise scans.

In order to provide more specific examples for the commonly used function g(f(x)) and the corresponding function parameters, in the following such examples are provided using respective formulae. In particular, the apparatus of FIG. 4 may be configured such that the function 52 defining the relationship between a set x of previously coded transform coefficients on the one hand, and a context index number 54 indexing the context and the symbolization parameter 46 on the other hand, may be $$g(f(x)) \text{ where } g(x) = \sum_{i=1}^{d_f} \delta^1(x, n_1)| \text{ and } f(x) = \sum_{i=1}^{d} w_i \cdot h \cdot \delta(x_i, t)$$

with $$\delta(x, t) = \begin{cases} 1 & |x| \geq t \\ 0 & |x| < t \end{cases} \text{ and } \delta'(x, n) = \begin{cases} 1 & x > n \\ 0 & x \leq n \end{cases}$$

where t and $\{x_{y^2}, \ldots, n_{d_f}\}$=n and, optionally from the function parameter, x=$\{x_i, \ldots, x_d\}$ with $x_i$ with i ∈ $\{1 \ldots d\}$ representing a previously decoded transform coefficient i, $w_i$ are weighting values each of which may be equal to one or unequal to one, and h is a constant or function of $x_i$.

It follows that g(f(x)) lies within $[0,d_f]$. If g(f(x)) is used to define an context index offset number $ctx_{offset}$ which is summed-up along with at least one base context index offset number $ctx_{base}$, then the value range of resulting context index ctx=$ctx_{base}$+$ctx_{offset}$ is $[ctx_{base}, ctx_{base}+d_f]$. Whenever it is mentioned that differing sets of contexts are used to entropy code symbols of symbol sequences 44, then $ctx_{base}$ is chosen differently such that $[ctx_{base,1} \; ctx_{base}+d_f]$ does not overlap $[ctx_{base,2}; ctx_{base}+d_f]$. This is, for example, true for
  transform coefficients belonging to transform blocks of differing size;
  transform coefficients belonging to transform blocks of differing information component type such as depth, luma, chroma and so forth;
  transform coefficients belonging to differing frequency portions of the same transform block;

As mentioned before, the symbolization parameter may be a Rice parameter k. That is, (absolute) levels within interval 16, i.e. X, with X+M=x (where M is the maximum level of interval 16 and x is the (absolute)transform coefficient level) would be mapped onto a bin string having a prefix and a suffix, the prefix being a unary code of $[X \cdot 2^k]$, and the suffix being a binary code of the remainder of $[X \cdot 2^k]$. $d_f$ may also form part of the function parameter, d may also form part of the function parameter.

A difference in function parameter such as between context selection and symbolization parameter determination necessitates merely one difference in either t, $\{n_1, \ldots, n_{d_f}\}$=n, df (if forming part of the function parameter), or d (if forming part of the function parameter).

As explained above, the index i may index the transform coefficients 12 within template 56, $x_i$ may be set to zero in case of the respective template position lying outside the transform block. Further, the context adaptive entropy encoder 36 may be configured such that the dependency of the context from the previously coded transform coefficients via the function is such that $x_i$ is equal to the transform coefficient level of the previously coded transform coefficient i in case same is within the first level interval 16, and is equal to the maximum level of the first interval 16, in case of the transform coefficient level of the previously coded transform coefficient i being within the second level interval 18, or such that $x_i$ is equal to the transform coefficient level of the previously coded transform coefficient i, independent from the transform coefficient level of the previously coded transform coefficient i being within the first or second level interval.

As far as the symbolization parameter determinator is concerned, same may be configured such that, in the determination of the symbolization parameter, $x_i$ is equal to the transform coefficient level of the previously coded transform coefficient i, independent from the transform coefficient level of the previously coded transform coefficient i being within the first or second level interval.

The apparatus may be further configured such that $n_1 \leq \leq n_{d_f}$ applies in any case.

The apparatus may also be configured such that h=$|x_i|$−t.

In a further embodiment the apparatus may be configured to spatially determine the previously coded transform coefficients depending on a relative spatial arrangement of the transform coefficients relative to the current transform coefficient, i.e. based on a template around the current transform coefficient's position.

The apparatus may be further configured to determine a position of a last non-zero transform coefficient L among transform coefficients of a transform coefficient block 10 along a predetermined scan order 14, and to insert information on the position into the data stream 32, wherein the plurality of transform coefficients encompasses the transform coefficients from the last non-zero transform coefficient L to a beginning of the predetermined scan order, i.e. a DC component transform coefficient.

In a further embodiment, the symbolizer 34 may configured to use a modified first symbolization scheme for symbolization of the last transform coefficient L. According to the modified first symbolization scheme, merely non-zero transform coefficient levels within the first level interval 16 may be mapped, while a zero level is presumed not to apply for the last transform coefficient L. For example, the first bin of the truncated unary binarization may be suppressed for coefficient L.

The context adaptive entropy encoder may be configured to use a separate set of contexts for entropy encoding the first set of one or more symbols for the last non-zero transform coefficient, separate from contexts used in entropy encoding the first set of one or more symbols of other than the last non-zero transform coefficient.

The context adaptive entropy encoder may traverse the plurality of transform coefficients in an opposite scan order leading from the last non-zero transform coefficient to the DC transform coefficient of the transform coefficient block. This may or may not also apply for the second symbol sequences 42.

Figure 5A:
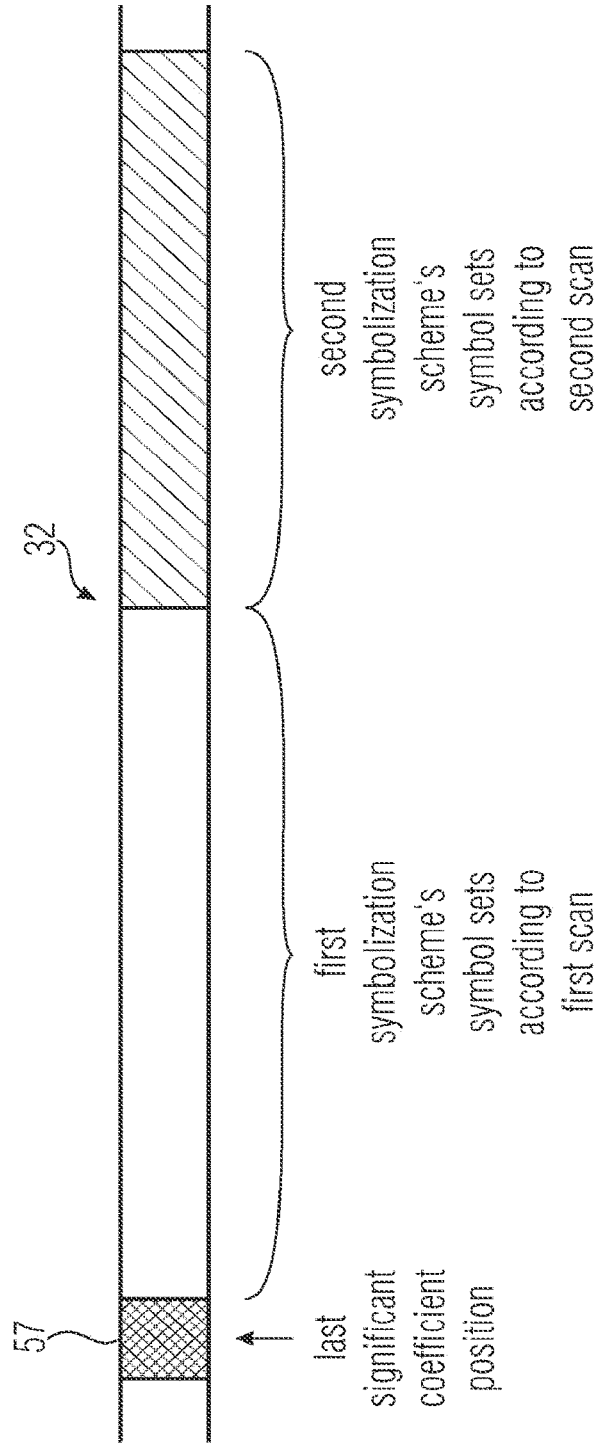
FIGS. 5a and 5b show schematic diagrams of a structure for the data stream resulting in accordance with different embodiments.

The apparatus may also be configured to code the plurality of transform coefficients into the data stream 32 in two scans, wherein the context adaptive entropy coder 36 may be configured to entropy encode the first symbols sequences 44 for the transform coefficients into the data stream 32 in an order corresponding to a first scan of the transform coefficients, wherein the inserter 40 is configured to subsequently insert the symbol sequences 42 for the transform coefficients having a transform coefficient level within the second level interval 18 into the data stream 32 in an order corresponding to an occurrence of the transform coefficients having a transform coefficient level within the second level interval 18 within a second scan of the transform coefficients. An example for a resulting data stream 32 is shown in FIG. 5a: it may comprise, optionally, in information 57 on the position of L, followed by the symbol sequences 42 in entropy encoded form (at least some in context adaptive entropy encoded form) and further followed by the symbol sequences 44 inserted directly or using, for example, bypass mode (equal probable alphabet).

Figure 5B:
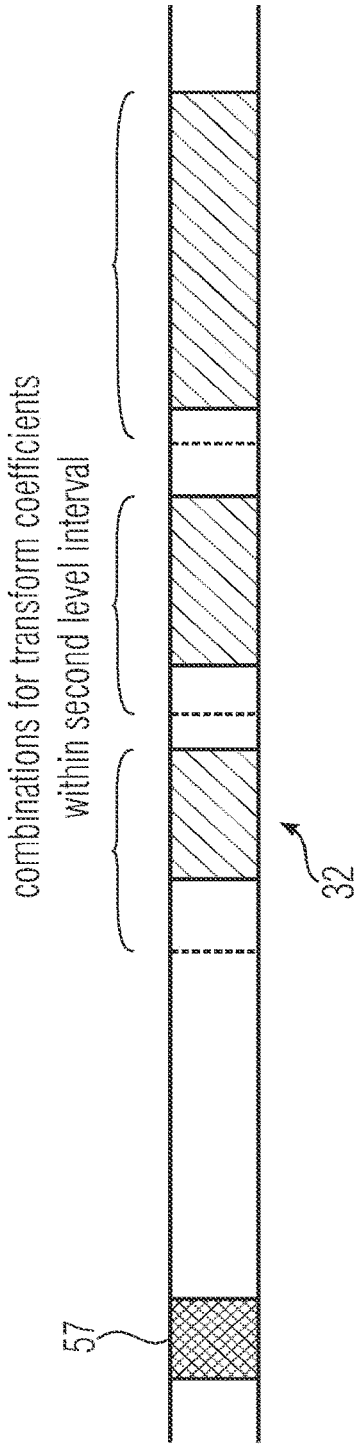

In a further embodiment, the apparatus may be configured to code the plurality of transform coefficients into the data stream 23 sequentially in one scan, wherein the context adaptive entropy encoder 36 and the inserter 40 are configured to, for each transform coefficient in a scan order of the one scan, insert the symbol sequences 42 of respective transform coefficients having a transform coefficient level within the second level interval 18 into the data stream 32 immediately subsequent to the context adaptive entropy coder's entropy encoding of the symbol sequence 44 into the data stream 32, along with which same form the combination onto which transform coefficients are mapped, so that the symbol sequences 42 are interspersed into the data stream 32 between symbol sequences 44 of the transform coefficients. The result is illustrated in FIG. 5b.

The inserter 40 may be configured to insert the symbol sequences 42 into the data stream directly or suing entropy encoding using a fixed probability distribution. The first symbolization scheme may be a truncated unary binarization scheme. The second symbolization scheme may be such that the symbol sequences 42 are of a Rice code.

Figure 6:
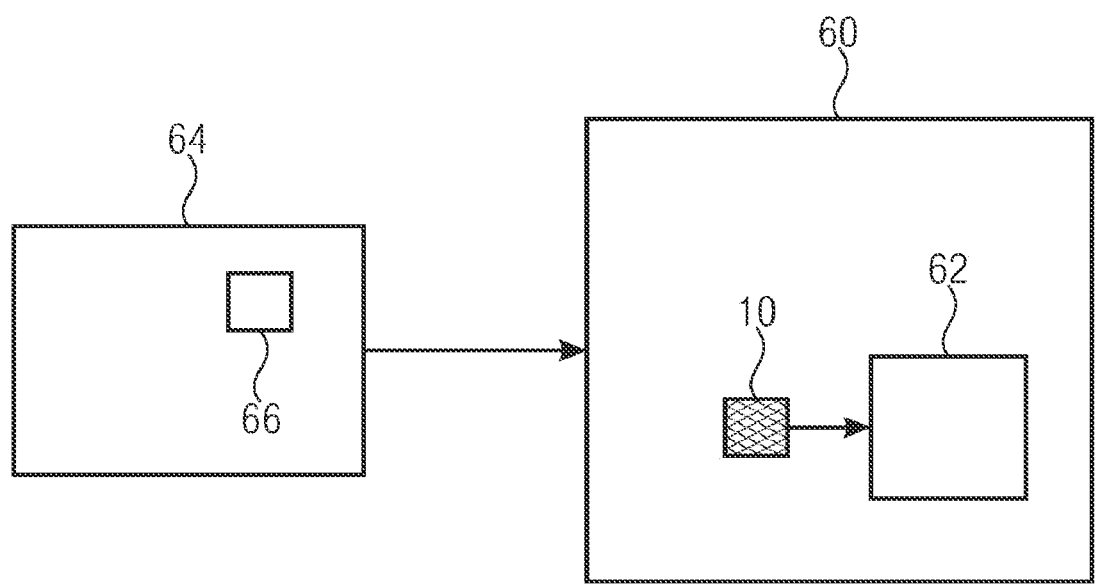
FIG. 6 shows a block diagram of a picture encoder in accordance with an embodiment.

As already noted above the embodiments of FIG. 4 may be implemented within an image/video coder. An example of such an image/video coder or picture coder is shown in FIG. 6. The picture encoder is generally indicated at reference sign 60 and comprises an apparatus 62 corresponding to the one shown in FIG. 4, for example. The encoder 60 is configured to, in encoding a picture 64, transform blocks 66 of the picture 64 into transform coefficient blocks 10 which are then treated by apparatus 62 so as to code, per transform block 10, a plurality of transform coefficients thereof. In particular, apparatus 62 processes transform blocks 10 transform block by transform block. In doing so, apparatus 62 may use function 52 for blocks 10 of different sizes. For example, an hierarchical multi-tree subdivision may be used in order to decompose picture 64 or tree-root blocks thereof, into blocks 66 of different sizes. The transform blocks 10 resulting from applying a transform to these blocks 66 are, accordingly, also of different size and although, accordingly, function 52 may be optimized for the different block sizes by way of using different function parameters, the overall overhead for providing such different dependencies for the symbolization parameter on the one hand and the context index on the other hand is kept low.

Figure 7:
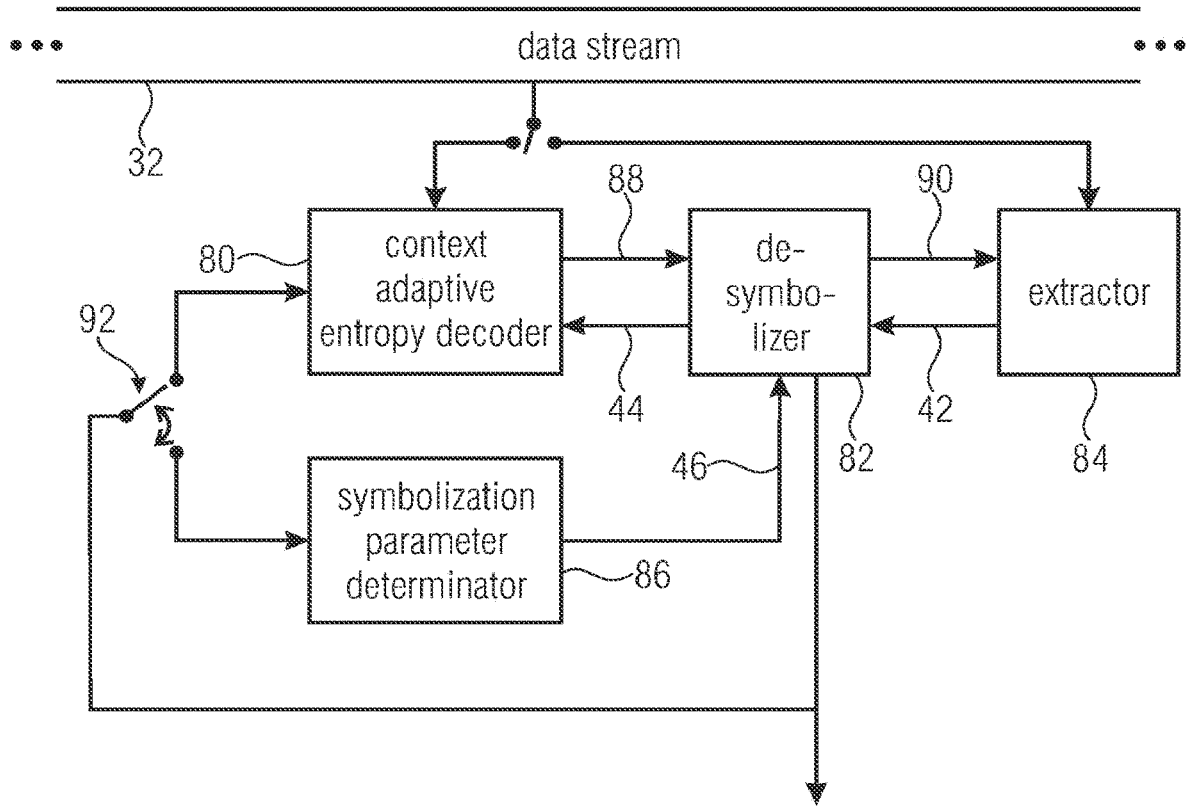
FIG. 7 shows a block diagram of an apparatus for decoding a plurality of transform coefficients in accordance with an embodiment.

FIG. 7 shows an apparatus for decoding a plurality of transform coefficients having transform coefficient levels from a data stream 32 which fits to the apparatus outlined above with respect to FIG. 4. In particular, the apparatus of FIG. 7 comprises a context adaptive entropy decoder 80, a desymbolizer 82 and an extractor 84 as well as a symbolization parameter determinator 86. The context adaptive entropy decoder 80 is configured to, for a current transform coefficient, entropy decode a first set of one or more symbols, i.e. symbol sequence 44, from the data stream 32. Desymbolizer 82 is configured to map the first set of one or more symbols, i.e. the symbol sequence 44, onto a transform coefficient level within the first level interval 16 in accordance with a first symbolization scheme. To be more precise, context adaptive entropy decoder 80 and desymbolizer 82 operate in an interactive manner. Desymbolizer 82 informs context adaptive entropy decoder 80 via a signal 88 at which symbol sequentially decoded by decoder 80 from data stream 32 a valid symbol sequence of the first symbolization scheme has been finalized.

Extractor 84 is configured to if the transform coefficient level onto which the first set at one or more symbols, i.e symbol sequence 44, is mapped in accordance with the first symbolization scheme, is the maximum level of the first level interval 16, extract a second set of symbols, i.e. symbol sequence 42 from data stream 32. Again, desymbolizer 82 and extractor 84 may operate in concert. That is, desymbolizer 82 may inform extractor 84 by a signal 90 when a valid symbol sequence of the second symbolization scheme has been finalized whereupon extractor 84 may finish the extraction of symbol sequence 42.

The desymbolizer 82 is configured to map the second set of symbols, i.e. symbol sequence 42, onto a position within the second level interval 18 in accordance with the second symbolization scheme which, as already noted above, is parameterizable in accordance with the symbolization parameter 46.

The context adaptive entropy decoder 80 is configured to, in entropy decoding at least one predetermined symbol of the first symbol sequence 44, use a context depending, via function 52, on previously decoded transform coefficients. The symbolization parameter determinator 86 is configured to, if the transform coefficient level onto which the first symbol sequence 44 is mapped in accordance with the first symbolization scheme is the maximum level of the first level interval 16, determine the symbolization parameter 46 depending, via function 52, on the previously decoded transform coefficients. To this end, inputs of entropy decoder 80 and symbolization parameter determinator 86 are connected via a switch 92 to an output of desymbolizer 82 at which desymbolizer 82 outputs values $x_i$ of the transform coefficients.

As described above, for context adaptivity, decoder 80 manages contexts by storing and updating an alphabet probability distribution estimate for each context. Each time a symbol of a certain context is decoded, the currently stored alphabet probability distribution estimate is updated using the actual/decoded value of this symbol thereby approximating the symbols' actual alphabet statistics of that context.

Likewise, symbolization parameter determinator 86 is configured to determine the symbolization parameter 46 for the second symbolization scheme and its symbol sequences 42 depending on previously decoded transform coefficients.

Generally, all the possible modifications and further details described above with respect to the encoding are also transferable onto the apparatus for decoding FIG. 7.

Figure 8:
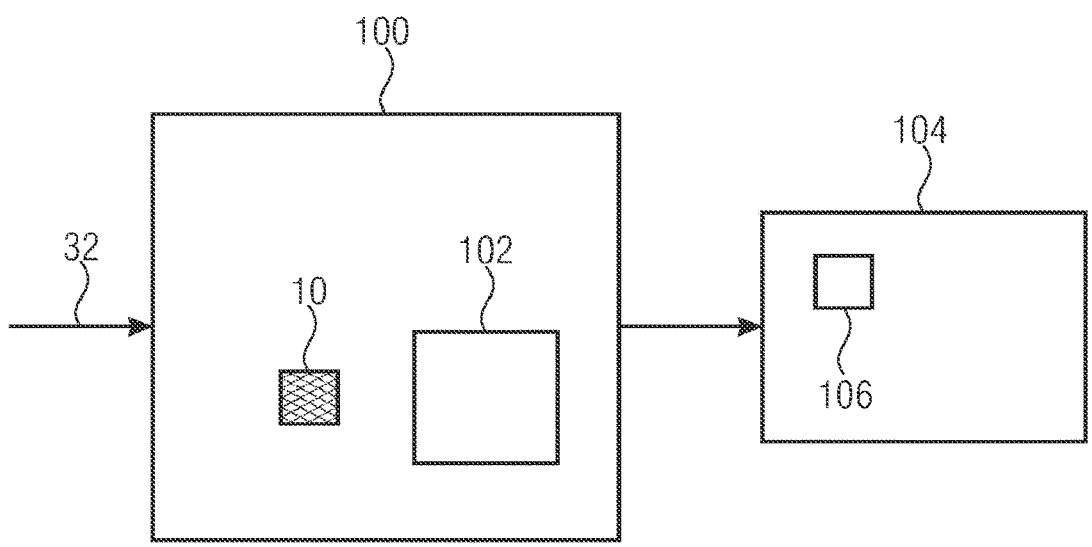
FIG. 8 shows a block diagram of a picture decoder in accordance with an embodiment.

FIG. 8 shows as a pendant to FIG. 6. That is, the apparatus of FIG. 7 may be implemented within the picture decoder 100. The picture decoder 100 of FIG. 7 comprises an apparatus according to FIG. 7, namely apparatus 102. The picture decoder 100 is configured to, in decoding or reconstructing a picture 104, retransform blocks 106 of picture 104 from transform coefficient blocks 10 the plurality of transform coefficients of which apparatus 102 decodes from the data stream 32 which, in turn, enters picture decoder 100. In particular, apparatus 102 processes transform blocks 10 block by block and may, as already denoted above, use function 52 commonly for blocks 106 of different sizes.

It should be noted that picture encoder and decoder 60 and 100, respectively, may be configured to use predictive coding with applying the transform/retransform to the prediction residual. Moreover, the data stream 32 may have subdivision information encoded therein, which signals to picture decoder 100 the subdivision into the blocks individually subject to transformation.

Below, the above embodiments are again described in some other words, and with providing more details on specific aspects which details may individually transferred onto the above embodiments. That is, above embodiments related to a specific way of context modeling for the coding of syntax elements related to transform coefficients such as in block-based image and video coders, and aspects thereof are described and highlighted further below.

The embodiments may relate to the field of digital signal processing and, in particular, to a method and apparatus for image and video decoders and encoders. In particular, the coding of transform coefficients and their associated syntax elements in block-based image and video codecs may be performed in accordance with the embodiments described. In so far, some embodiments represented an improved context modeling for the coding of syntax elements related to transform coefficients with an entropy coder that employs a probability modeling. Further, the derivation of a Rice parameter that is used for the adaptive binarization of the remaining absolute transform coefficients may be done as described above with respect to the symbolization parameter. Unification, simplification, parallel processing friendly, and moderate memory usage in terms of context memory are the benefits of the embodiments compared to straight forward context modeling.

In even other words, embodiments of the present invention may reveal a new approach for context model selection of syntax elements related to the coding of transform coefficients in block-based image and video coders. Further, derivation rules for a symbolization parameter, such as a Rice parameter, that controls the binarization of a remaining value of an absolute transform coefficients have been described. Essentially, the above embodiments used a simple and common set of rules for the context model selection for all or for a part of syntax elements related to the coding of the transform coefficients.

The first symbolization scheme mentioned above may be a truncated unary binarization. If so, coeff_significant_flag, coeff_abs_greater_1, and coeff_abs_greater_2 may he called the binary syntax elements or symbols which form the first, the second, and the third bin resulting from the truncated unary binarization of a transform coefficient. As described above, the truncated unary binarization may merely represent a prefix, which may be accompanied by the suffix being itself a Rice code in case of the transform coefficient's level falling within the second level interval 18. A further suffix may be of a Exp-Golomb code such as of 0-order, thereby forming a further level interval following the first and second intervals 16 an 18 in FIG. 2 (not show in FIG. 2).

The derivation of the Rice parameter for the adaptive binarization of the remaining absolute transform coefficient may be done, as described above, based on the same set of rules 52 as used for the context model selection.

With respect to the scan order, it is noted that same may be varied compared to the above description. Moreover, different block sizes and shapes may be supported by the apparatuses of FIGS. 4 and 6, with using, however, the same set of rules, i.e. with using the same function 52. Accordingly, a unified and simplified scheme for the context model selection of syntax elements related to the coding of transform coefficients combined with a harmonization for the derivation of symbolization parameter may be achieved. Thus, the context model selection and symbolization parameter derivation may use the same logic which may be hardwired, programmed hardware or a software-subroutine, for example.

To achieve a common and simple scheme for context model selection and derivation of the symbolization parameter, such as Rice parameter, already coded transform coefficients of a block or a shape may be evaluated as described above. In order to evaluate the already coded transform coefficients, the separation in coding of coeff_significant_flag, which is the first bin resulting from the binarization (which could be referred to as the coding of the significance map), and the remaining absolute value of the transform coefficient level is performed using a common function 52.

The coding of the sign information may be done in an interleaved manner, i.e. by coding the sign directly after the coding of the absolute transform coefficient. Thus, the whole transform coefficients would be coded in one scan pass only. Alternatively, the sign information can be coded in a separate scanning path as long as the evaluation values f(x) rely on absolute level information only.

As denoted above, the transform coefficients may be coded in a single scan pass or in multiple scan passes. This be enabled by, or described by, a cutoff set c the coefficients $c_i$ of which indicate the number of symbols of the transform coefficient's (first and second) symbolization processed in scan i. In the case of an empty cutoff set, one scan would be used. In order to have improved results for the context model selection and the derivation of the symbolization parameter, the first cutoff parameter $c_o$ of the cutoff set c should be larger than one.

Note that cutoff set c may be chosen to be c={$c_d$, $c_i$} with $c_o$=1 and $c_i$=3 and |c|=2, where $c_o$ indicates the number of bins/symbols of the first binarization, encompassed in the first scan, and $c_i$=3 indicating the symbol position within the first binarization up to which symbols of the first binarization are covered be the second scan. Another example is given when the scheme codes first bin resulting from the binarization for a whole block or shape in a first scan pass, next the second bin for the whole block or shape in a second scan pass, with $c_o$ equal to one, $c_i$ equal to two, and so on.

Figure 9:
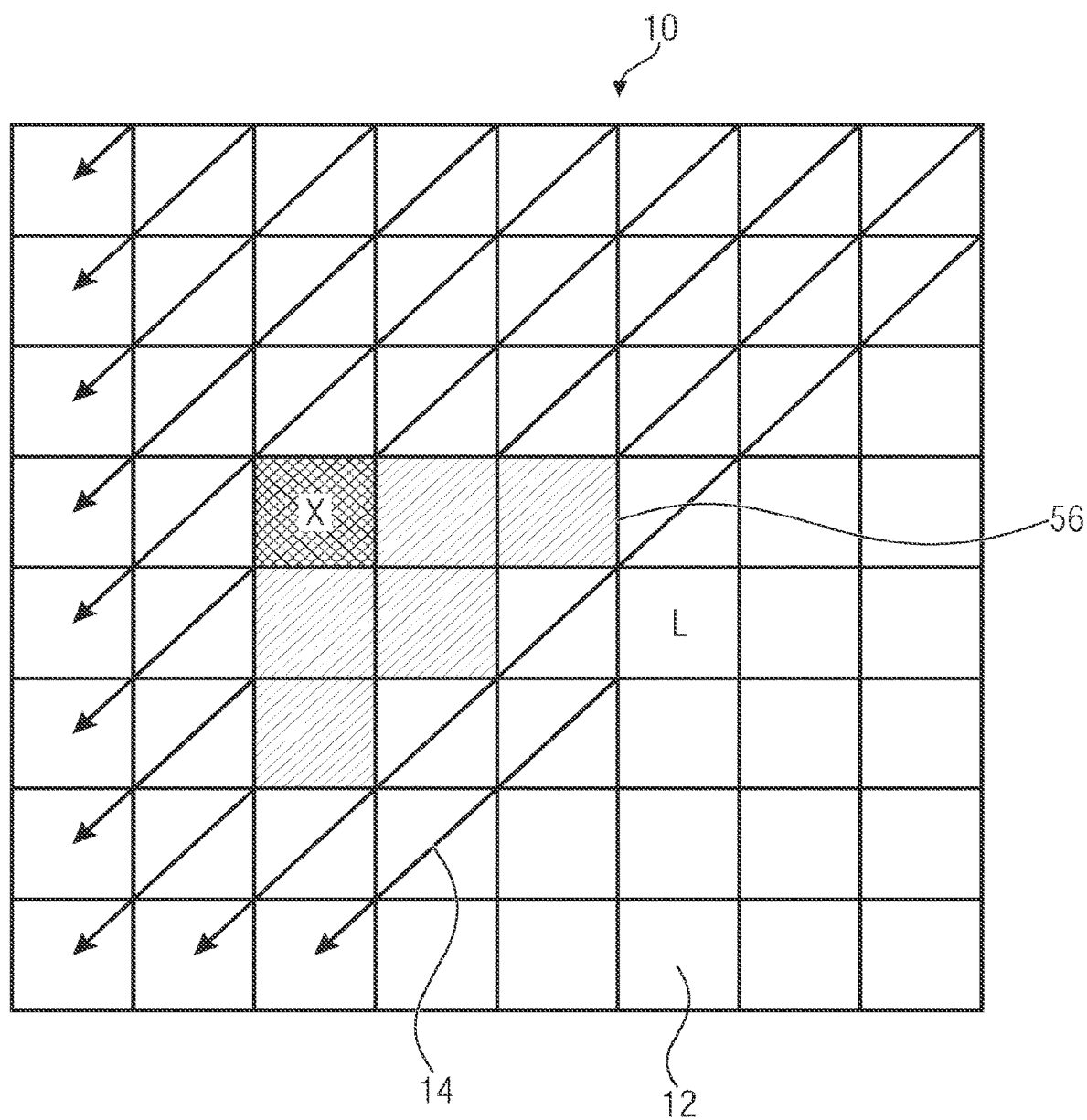
FIG. 9 shows a schematic diagram of a transform coefficient block so as to illustrate a scan and a template in accordance with an embodiment.

The local template 56 for the coding of coeff_significant_flag, i.e. the first bin from the binarization process, may be designed as shown in FIG. 1 or as shown in FIG. 9. As a unification and simplification, the local template 56 may be used for all block sizes and shapes. Instead of evaluating the number of neighbors with transform coefficient inequality to zero only, the whole transform coefficients are input into function 52 in form of $x_i$. Note that the local template 56 can be fixed, i.e. independent from the current transform coefficient's position or scan index and independent from the previously coded transform coefficients, or adaptive, i.e. dependent from the current transform coefficient's position or scan index and/or the previously coded transform coefficients, and the size can be fixed or adaptive. Further, when the template size and shape is adjusted allowing the coverage of all scan positions of a block or a shape, all already coded transform coefficients or all already coded transform coefficients up to a specific limit are used for the evaluation process.

As an example, FIG. 9 shows another example for the local template 56 which may be used for an 8×8 transform block 10 with diagonal scan 14. L denotes the last significant scan position and the scan positions marked with an x denotes the current scan position. Note that for other scan orders, the local template may be modified to fit the scan order 14. For example, in case of a forward diagonal scan, the local template 56 may be flipped along the diagonals.

The context model selection and symbolization parameter derivation may be based on different evaluation values f(x) resulting from the evaluation of already coded neighbors $x_i$. This evaluation is done for all scan positions having already coded neighbors covered by the local template 56. The local template 56 has a variable or fixed size and may depend on the scan order. However, the template shape and size is an adaptation to the scan order only and therefore the derivation of the values f(x) is independent from the scan order 140 and the template's 56 shape and size. Note that by setting the size and the shape of the template 56 such that the coverage of all scan positions of a block 10 for every scan position is allowed, the usage of all already coded transform coefficients in the current block or shape is achieved.

As state before, the selection of the context model indices and the derivation of the symbolization parameter use evaluation values f(x). In general, a generic set of mapping functions maps the resulting evaluation values f(x) onto a context model index and on a specific symbolization parameter. In addition to that, additional information as the current spatial position of the current transform coefficient of the transform block or shape 10 or the last significant scan position L may be used for the selection of context models related to the coding of transform coefficients and for the derivation of the symbolization parameter. Note that the information resulting from the evaluation and spatial location or the last information may be combined and therefore specific weighting is possible. After the evaluation and the derivation process, all parameters (context model indices, symbolization parameter) are available for the coding of a whole transform coefficient level or a transform coefficient up to a specific limit.

As an example configuration of the presented invention, the cutoff set size is empty. This means, each transform coefficient is transmitted completely before processing the next transform coefficients along the scan order.

The evaluation values f(x) may result from the evaluation of already coded neighbors $x_i$ covered by the local template 56. A specific mapping function $f_t(x)$ maps the input vector to an evaluation value used to select the context model and the Rice parameter. The input vector x may consist of transform coefficient values $x_i$ of the neighbors covered by the local template 56 and depends on the interleaving scheme. For example, if the cutoff set c is empty and the sign is coded in a separate scan pass, the vector x consists of absolute transform coefficients $x_i$ only. In general, the values of the input vector x can be signed or unsigned. The mapping function can be formulated as follows with an input vector x of dimension of d (given t as a constant input).

$$f_t(x) = \sum_{i=1}^{i=d} w_i \, g_t(x_i)\delta(x_i, t)$$

To be more specific, the mapping function $f_t(x)$ may be defined as follows with an input vector x of dimension of d (given t as a constant input).

$$f_t(x) = \sum_{i=1}^{i=d} w_i \, (|x_i| - t)\delta(x_i, t)$$

That is, $g_t(x_i)$ may be $(|x_i|-t)$. In the latter formula, the function $\delta$ is defined as follows (given t as a constant input):

$$\delta(x, t) = \begin{cases} 1 & |x| \geq t \\ 0 & |x| < t \end{cases} \quad (1)$$

Another kind of evaluation value is the number of neighboring absolute transform coefficients levels larger or smaller than a specific value t defined as follows:

$$f_t(x) = \sum_{i=0}^{i=d} w_i \, \delta(x_i, t)$$

Note that for both kind of evaluation values, an additional weighting factor controls the importance of a specific neighbor is possible. For example, the weighting factor $w_i$ is higher for neighbors with shorter spatial distance than for neighbors with larger spatial distance. Further, the weighting is neglected when setting all $w_i$ to one.

As an example configuration of the presented invention, $f_0$, $f_1$, $f_2$ and $f_3$ are evaluation values with respective t of {0, 1, 2, 3} and $\delta(x_i)$ as defined in (1). For this example, $f_0$ is used for the derivation of the context index of the first bin, $f_1$, for the second bin, $f_2$ for the third bin, and $f_3$ for the Rice parameter. In another example configuration, Jo is used for the context model selection of the first bin, while $f_3$ is taken for the context model selection of the second, the third bin, and the Rice parameter. Here, the Rice parameter serves as a representative also for other symbolization parameters.

The context model selection for all syntax elements or bin indices in the entropy coding and the symbolization parameter uses the same logic by employing the evaluation values f(x). In general, a specific evaluation value f(x) is mapped by another mapping function g(x,n) to a context model index or a symbolization parameter. A specific mapping function is defined as follows with d as the dimension of the input vector n.

$$g(x) = \sum_{i=1}^{i=d} \delta(x, n_i)$$

For this mapping, the function $\delta(x,n)$ can be defined as follows.

$$\delta(x, n) = \begin{cases} 1 & x > n \\ 0 & x \leq n \end{cases}$$

The dimension d of the input vector n and the values the vector n may be variable and depend on the syntax element or bin index. Further, the spatial location inside of the transform block or shape may be used to add or subtract (or to move) the selected context model index.

The first scan position in scanning the transform coefficients when coding/decoding same, may be the last scan position L when applying the scan direction of FIG. 1 pointing from DC to highest frequency. That is, at least the first scan of the scans for traversing the coefficients in order to code/decode same, may point from coefficient to L to DC. For this scan position L, the first bin index may be neglected as the last information already signalized that this scan position consists of a transform coefficient unequal to zero. For this scan position, a separate context model index can be used for the coding of the second and the third bin resulting from the binarization of the transform coefficient.

As an example configuration of the presented invention, the resulting evaluation value $f_0$ is used as input together with the input vector n={1,2,3,4,5}, and the resulting value is the context model index for the first bin. Note that, in case of evaluation value equal to zero, the context index is zero. The same scheme is applied with the evaluation value $f_1$ and the input vector n={1,2,3,4} and the resulting value is the context model index for the second and the third bin of the binarization. For the Rice parameter, $f_3$ and n={0,5,19} is used. Note that the maximum Rice parameter is three and therefore no change in the maximum Rice parameter compared to the state-of-the-art is done by the presented invention. Alternatively, $f_r$ can be used to derive the Rice parameter. For that configuration, the input vector should be modified to n={3,9,21}. Note that the underlying set of rules are the same for all syntax element or bin indices and for the Rice parameter, only the parameters or threshold sets (input vector n) are different. Further, depending on the diagonal of the current scan position, the context model index may be modified as stated before by add or subtract a specific amount. An equivalent description for that is the selection of another disjoint context model set. In an example implementation, the resulting context model index for the first bin is moved by 2*|ctx0|if the current scan position lies on the first two diagonals. If the current scan position lies on the third and the fourth diagonal, the context model index for the first bin is moved by |ctx0|, where |ctx0| is the number of maximum context models resulting from the derivation base on the evaluation values resulting in disjoint context model sets. This concept is used for luma planes only for an example implementation, while no further offset is added in case of chroma avoiding context dilution (i.e. not enough bins are coded with an adaptive context model and the statistic cannot be tracked by the context model). The same technique may be applied to the context model index of the second and the third bin. Here, in an example configuration of the presented invention, the threshold diagonals are three and ten. Again, this technique is applied to the luma signal only. Note that it is also possible to extend this technique to the chroma signals. Further, note that the additional index offset depending on diagonals can be formulated as follows.

$$ctx_{offset} = d_i * idx_{inc}$$

In this formula, $d_i$ denotes the weight for the diagonal of the current scan position and $idx_{inc}$ denotes the step size. Further, note that the offset index can be inverted for practical implementations. For the stated example implementation, an inversion would be set the additional index to zero if the current scan position lies on the first and the second diagonal, is moved by |ctx0| for the third and the fourth diagonal and is 2*|ctx0| otherwise. By using the given formula, the same behavior as for the example configuration is achieved when setting $d_0$ and $d_1$ to 2; $d_3$ and $d_4$ to 1 and the all remaining diagonal factors to 0.

Even if the context model index is equal for different block sizes or plane types (e.g. luma and chroma), the base context model index can be different resulting in different set of context models. For example, the same base index for block sizes larger than 8×8 in luma may be used, while the base index may be different for 4×4 and 8×8 in luma. In order to have a meaningful number of context models, the base index may, however, be grouped in a different way.

As an example configuration, the context models for 4×4 blocks and the remaining blocks may be different in luma, while the same base index may be used for the chroma signal. In another example, the same base index may be used for both luma and chroma signals, while the context models for luma and chroma are different. Furthermore, the context models for the second and the third bins may be grouped resulting in a smaller number of context memory. If the context model index derivation for the second and the third bin is equal, the same context model may be used to transmit the second and the third bin. By a right combination of base index grouping and weighting, a meaningful number of context models may be achieved resulting in a saving of context memory.

In an embodiment of the invention, the cutoff set c is empty. That is, merely one scan is used. For this embodiment, the sign information can be interleaved using the same scan pass or can be coded in a separate scan pass. In another embodiment, the set size c is equal to one and $c_0$, the first and the only value of the cutoff set c is equal to three. This corresponds to the example illustrated above with using two scans. In this embodiment, the context model selection may be done for all three bins resulting from the truncated unary binarization while the symbolization parameter derivation such as Rice parameter selection may be done using the same function 52.

In an embodiment, the size of the local template is five. The size of the local template may be four. For this embodiment, the neighbor with the spatial distance of two in vertical direction may be removed compared to FIG. 8. In a further embodiment, the template size is adaptive and is adjusted to the scan order. For this embodiment, the neighbor that is coded in a processing step before is not included into the template just as it is the case in FIGS. 1 and 8. By doing this, the dependency or latency is shortened, resulting in a higher processing order. In a further embodiment, the template size and shape is adjusted large enough (e.g. same block or shape size of the current block or shape). In another embodiment, two local templates may be used and they may be combined by a weighting factor. For this embodiment, the local templates may differ in size and shape.

In an embodiment, $f_0$ may be used to select the context model index for the first bin and $f_1$ for the second bin, the third bin, and the Rice parameter. In this embodiment, the input vector n={1,2,3,4,5} resulting in 6 context models. The input vector n for the second and the third bin index may be the same and n={1,2,3,4}, while the input vector n for the Rice parameter may be n={3,9,21}. Furthermore, in an embodiment, the afore-mentioned frequency portions of the transform block within which separate context sets are used, may be formed by disjoint sets of diagonals (or lines) of the diagonal (raster) scan. For example, different context base offset numbers may exist for the first and second diagonals, the second and third diagonals and the fourth and fifth diagonals when seen from DC component, so that the context selection for coefficients in these diagonals takes place within disjoint sets of contexts. Note that the first diagonal is one. For the second and the third bin index, diagonals lying in the range between [0,2] have a weighting factor of two and diagonals lying in the range between [3,9] have a weighting factor of one. These additional offsets are used in the case of luma signal, while the weighting factors for chroma are all equal to zero. Also for this embodiment, the context model for the second and the third bin index of the first scan position, which is the last significant scan position, is separated from the remaining context models. This means that the evaluation process can never this separate context model.

In an embodiment, 4×4 luma blocks or shape uses a single set of context for the first bin, the context models for the remaining block sizes or shape are the same. In this embodiment, there is no separation between the block size or shape for the chrome signal. In another embodiment of the invention, there is no separation between sizes or shape results in the same base index or context model sets for all block sizes and shape. Note that for both embodiments, different set of context models are used for luma and chroma signals.

Below, an embodiment using a modified Rice parameter binarization according to above embodiments, but without context adaptive entropy coding is shown. According to this alternative coding scheme, the Rice binarization scheme is used only (with, optionally, addition of an Exp-Golomb suffix), Thus, no adaptive context model is necessitated to code a transform coefficient. For that alternative coding scheme, the Rice parameter derivation uses the same rule as for the above embodiments.

In other words, in order to reduce the complexity and context memory and to improve the latency in the coding pipeline, an alternative coding scheme that is based on the same set of rules or logic is described. For this alternative coding scheme, the context model selection for the first three bins resulting from the binarization is disabled and the first three bins resulting from the Truncated Unary binarization, i.e, the first symbolization scheme, may be coded with the fixed equal probability (i.e. with a probability of 0.5). Alternatively, the Truncated Unary binarization scheme is omitted and the interval bounds of the binarization scheme are adjusted. In this usage, the left bound of the Rice interval, i.e. interval 18, is 0 instead of 3 (with interval 16 vanishing). The right/upper bound for this usage can be unmodified or can be subtracted by 3. The derivation of the Rice parameter can be modified in terms of evaluation values and in terms of the input vector n.

Figure 10:
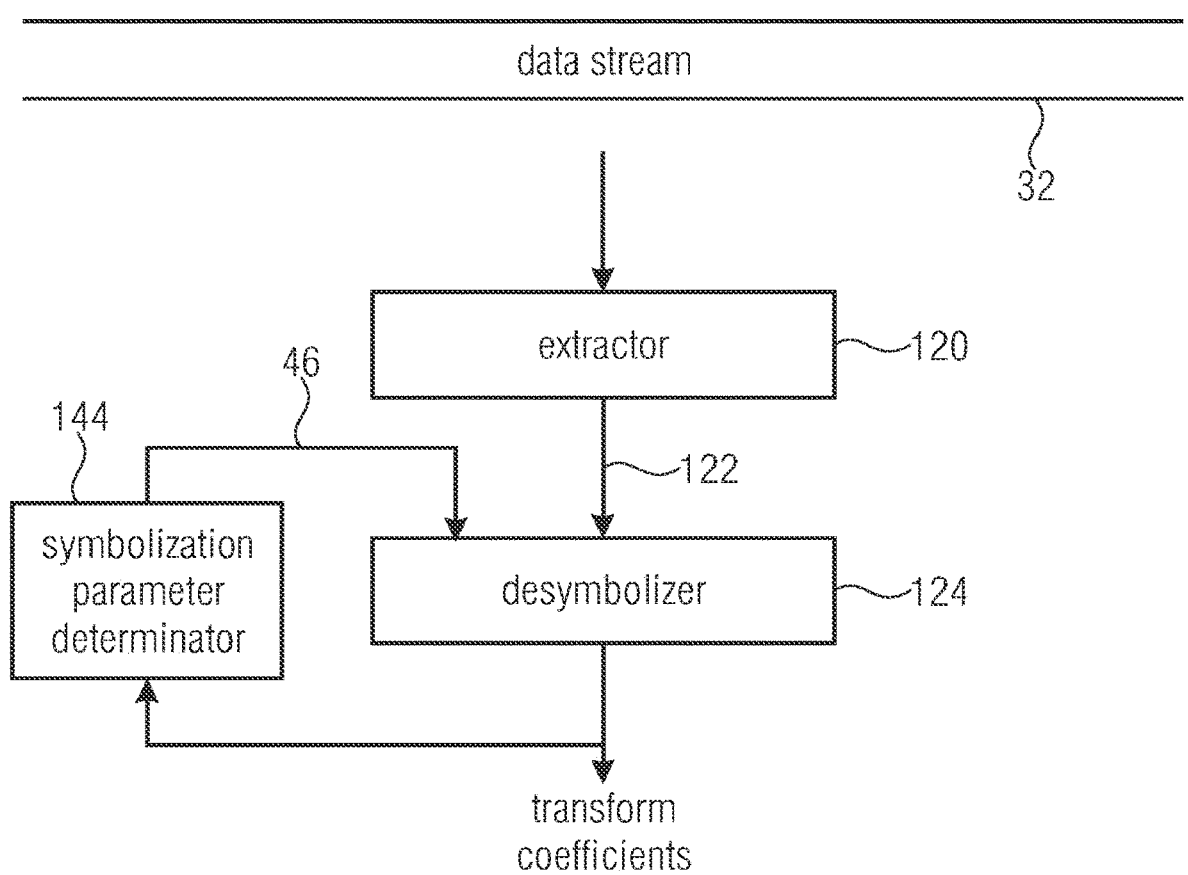
FIG. 10 shows a block diagram of an apparatus for decoding a plurality of transform coefficients in accordance with a further embodiment.

Thus, in accordance with the just-outlined modified embodiments, an apparatus for decoding a plurality of transform coefficients of different transform blocks, each having a transform coefficient level, from a data stream 32, may be constructed and operate as shown in, and described with respect to FIG. 10

The apparatus of FIG. 10, comprises an extractor 120 configured to extract a set of symbols or symbol sequence 122 from the data stream 32 for a current transform coefficient. The extraction is performed as described above with respect to extractor 84 of FIG. 7.

A desymbolizer 124 is configured to map the set 122 of symbols onto a transform coefficient level for the current transform coefficient in accordance with a symbolization scheme which is parameterizable in accordance with a symbolization parameter. The mapping may solely use the parameterizable symbolization scheme such as a Rice binarization, or may use this parametrizable symbolization scheme merely as a prefix or suffix of an overall symbolization of the current transform coefficient. In case of FIG. 2, for example, the parametrizable symbolization scheme, i.e the second one, formed the suffix relative to the first symbolization scheme's symbol sequence.

To present more examples, reference is made to FIGS. 11a and b. According to FIG. 11a, the interval range 20 of the transform coefficients is subdivided into three intervals 16, 18 and 126, together covering the interval range 20 and overlapping each other at a respective maximum level of the respective lower interval. If the coefficient level x is within the highest interval 126, the overall symbolization is a combination of symbol sequence 44 of the first symbolization scheme 128 symbolizing levels within interval 16, the symbol sequence forming a prefix, followed by a first suffix, namely a symbol sequence 42 of the second symbolization scheme 130 symbolizing levels within interval 18, and further followed by a second suffix, namely a symbol sequence 132 of a third symbolization scheme 134 symbolizing levels within interval 126. The latter may be an Exp-Golomb code such as of order 0. If the coefficient level x is within the mid interval 18 (but not within interval 126), the overall symbolization is a combination of merely prefix 44 followed by the first suffix 42. If the coefficient level x is within the lowest interval 16 (but not within interval 18), the overall symbolization is merely composed of prefix 44. The overall symbolization is composed such that same is prefix-free. Without the third symbolization, the symbolization according to FIG. 11a may correspond to the one of FIG. 2. The third symbolization scheme 134 may be a Golomb-Rice binarization. The second symbolization scheme 130 may form the paramatrizable one, although same could also be the first 128.

An alternative overall symbolization is shown in FIG. 1. Here, merely two symbolization schemes are combined. Compared to FIG. 11a, the first symbolization scheme has been left away. Depending on x within the interval 136 of scheme 134, or the interval 138 of scheme 130 (outside of interval 136), the symbolization of x comprises prefix 140 and suffix 142, or merely prefix 140.

Further, the apparatus of FIG. 10 comprises a symbolization parameter determinator 144 connected between the desymbolizer's output and a parameter input of desymbolizer 124. Determinator 144 is configured to determine the symbolization parameter 46 for the current transform coefficient depending, via function 52, on previously processed transform coefficients (as far as derivable from the desymbolized fragments or portions desymbolized/processed/decoded so far).

The extractor 120, the desymbolizer 124 and the symbolization parameter determinator 144 are configured to sequentially process the transform coefficients of the different transform blocks as it was described above. That is, scan 140 may be traversed in opposite direction within a transform block 10. Several scans may be used such as, for example, for the different symbolization fragments, i.e. prefix and suffix(es).

The function parameter varies depending on a size of the current transform coefficient's transform block, an information component type of the current transform coefficient's transform block and/or a frequency portion the current transform coefficient is located within the transform block.

The apparatus may be configured such that the function defining the relationship between the previously decoded transform coefficients on the one hand, and the symbolization parameter on the other hand, is g(f(x)), which function has already been described above.

As has also been discussed above, spatial determination of the previously processed transform coefficients depending on a relative spatial arrangement relative to the current transform coefficient may be used.

The apparatus may operate very easily and fast, as the extractor 120 may be configured to extract the set of symbols from the data stream directly or using entropy decoding using a fixed probability distribution. The parameterizable symbolization scheme may be such that the set of symbols is of a Rice code, and the symbolization parameter is a RICE parameter.

In other words, the desymbolizer 124 may be configured to restrict the symbolization scheme to a level interval such as 18 or 138 out of a range interval 20 of the transform coefficients so that the set of symbols represents a prefix or suffix with respect to other portions of an overall symbolization of the current transform coefficient such as 44 and 132, or 142. As to the other symbols, same may also be extracted from the data stream directly or using entropy decoding using a fixed probability distribution, but FIG. 1 to 9 showed that entropy coding using context adaptivity may also be used.

Apparatus of FIG. 10 may be used as apparatus 102 in the picture decoder 102 of FIG. 8.

Figure 12:
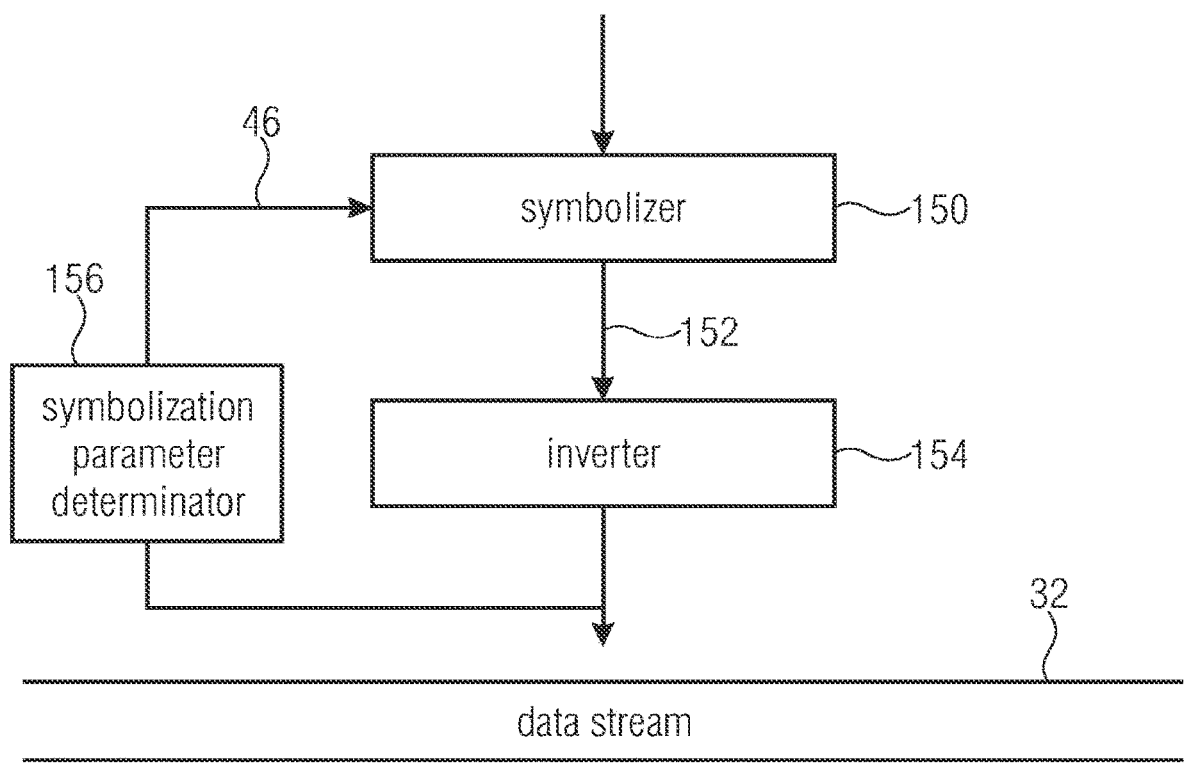
FIG. 12 shows a block diagram of an apparatus for coding a plurality of transform coefficients in accordance with a further embodiment.

For sake of completeness, FIG. 12 shows, an apparatus for coding a plurality of transform coefficients of different transform blocks, each having a transform coefficient level, into a data stream 32, fitting to apparatus of FIG. 10.

The apparatus of FIG. 12 comprises a symbolizer 150 configured to map a transform coefficient level for a current transform coefficient in accordance with a symbolization scheme which is parameterizable in accordance with a symbolization parameter, onto a set of symbols or symbol sequence.

An inserter 154 is configured to insert the set of symbols for the current transform coefficient into the data stream 32.

A symbolization parameter determinator 156 is configured to determine the symbolization parameter 46 for the current transform coefficient depending, via a function 52 parameterizable via a function parameter, on previously processed transform coefficients, and may, to this end, be connected between an output of inserter 152 and parameter input of symbolizer 150, or, alternatively, between output and input of symbolizer 150.

Inserter 154, symbolizer 150 and symbolization parameter determinator 156 may be configured to sequentially process the transform coefficients of the different transform blocks, and the function parameter varies depending on a size of the current transform coefficient's transform block, an information component type of the current transform coefficient's transform block and/or a frequency portion the current transform coefficient is located within the transform block.

As sated above with respect to the decoding apparatus of FIG. 10, the apparatus of FIG. 12 may be configured such that the function defining the relationship between the previously decoded transform coefficients on the one hand, and the symbolization parameter on the other hand, is g(f(x)), and the previously processed transform coefficients may spatially be determined depending on a relative spatial arrangement relative to the current transform coefficient. The inserter may be configured to insert the set of symbols into the data stream directly or using entropy encoding using a fixed probability distribution, and the symbolization scheme may be such that the set of symbols is of a Rice code, and the symbolization parameter is a RICE parameter. The symbolizer may be configured to restrict the symbolization scheme to a level interval out of a range interval 20 of the transform coefficients so that the set of symbols represents a prefix or suffix with respect to other portions of an overall symbolization of the current transform coefficient.

Figure 11B:
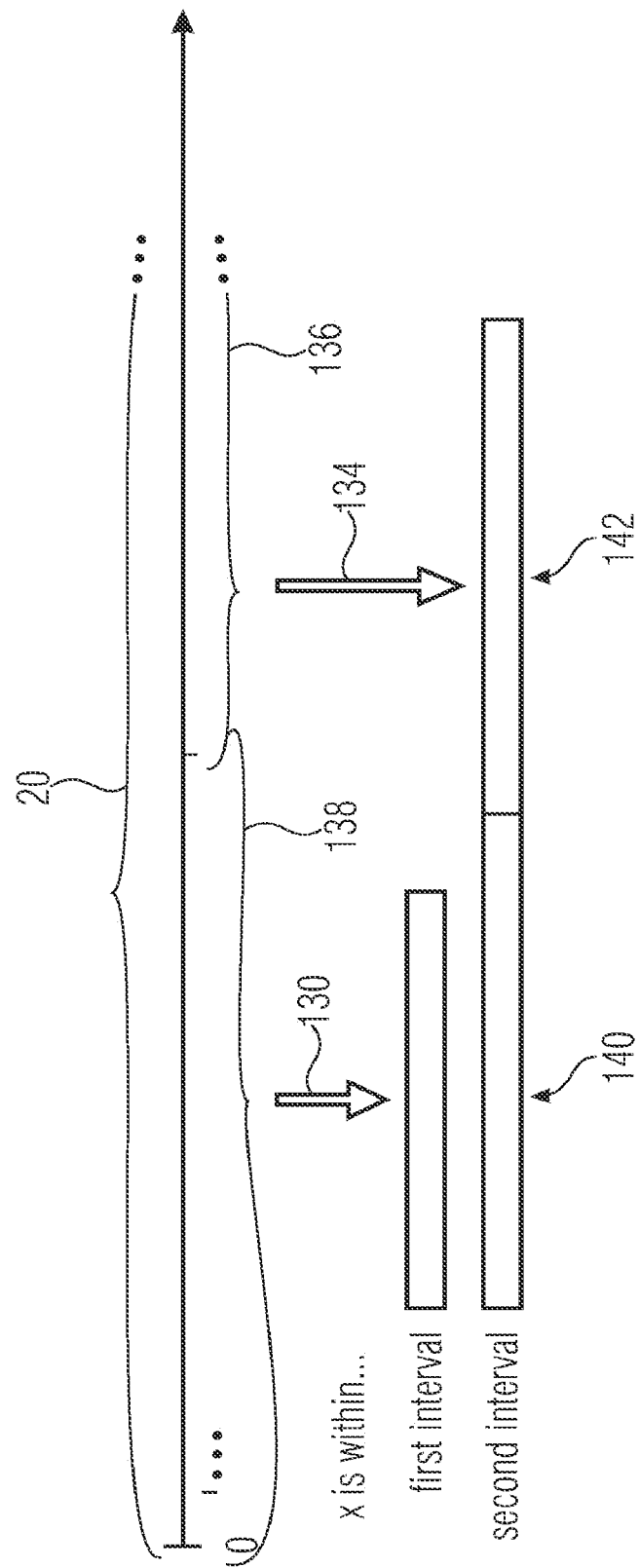

As mentioned above, in an implementation of FIG. 10 to 12 embodiments, the context model selection for the first three bins is disabled as compared to the embodiments of FIGS. 1 to 9. For this embodiment, the resulting bins from the Truncated Unary binarization 128 are coded with a fixed probability of 0.5. In a further embodiment, the Truncated Unary binarization 128 is omitted as shown in FIG. 11b and the bounds for the Rice interval is adjusted resulting in the same interval range as in the state of the art (i.e. left and right bounds minus 3). For this embodiment, the Rice parameter derivation rule is modified compared to the embodiment of FIGS. 1 to 9. Instead using $f_1$ as evaluation value, $f_0$ may be used, for example. Further, the input vector may be adjusted to n={4,10,22}.

A further embodiment described hereinbelow, illustrates the possibility of virtually having different templates for context selection/dependency on the one hand and symbolization parameter determination on the other hand. That is, the template of coefficients $x_i$ remains the same for both context selection/dependency and symbolization parameter determination, but the coefficients $x_i$ which participate in influencing f(x) is effectively rendered different between context selection/dependency and symbolization parameter determination by appropriately setting $w_i$ all coefficients $x_i$ for which weights $w_i$ are zero do not influence f(x) in accordingly, designing the portions of the template where $w_i$ is zero, different between context selection/dependency on the one hand and symbolization parameter determination on the other hand, effectively results in different "effective templates" for context selection/dependency and symbolization parameter determination. In other words, by setting some $w_i$ to zero for certain template positions i for one of the context selection/dependency and the symbolization parameter determination, while setting $w_i$ at these certain template positions i to non-zero values for the other of the context selection/dependency and the symbolization parameter determination, the template of the first-mentioned one the context selection/dependency and the symbolization parameter determination is effectively smaller than the template of the latter of the context selection/dependency and the symbolization parameter determination. Again, as already denoted above, the template may encompass all transform coefficients of the block, irrespective of the currently coded transform coefficient's position, for example.

Figure 13:
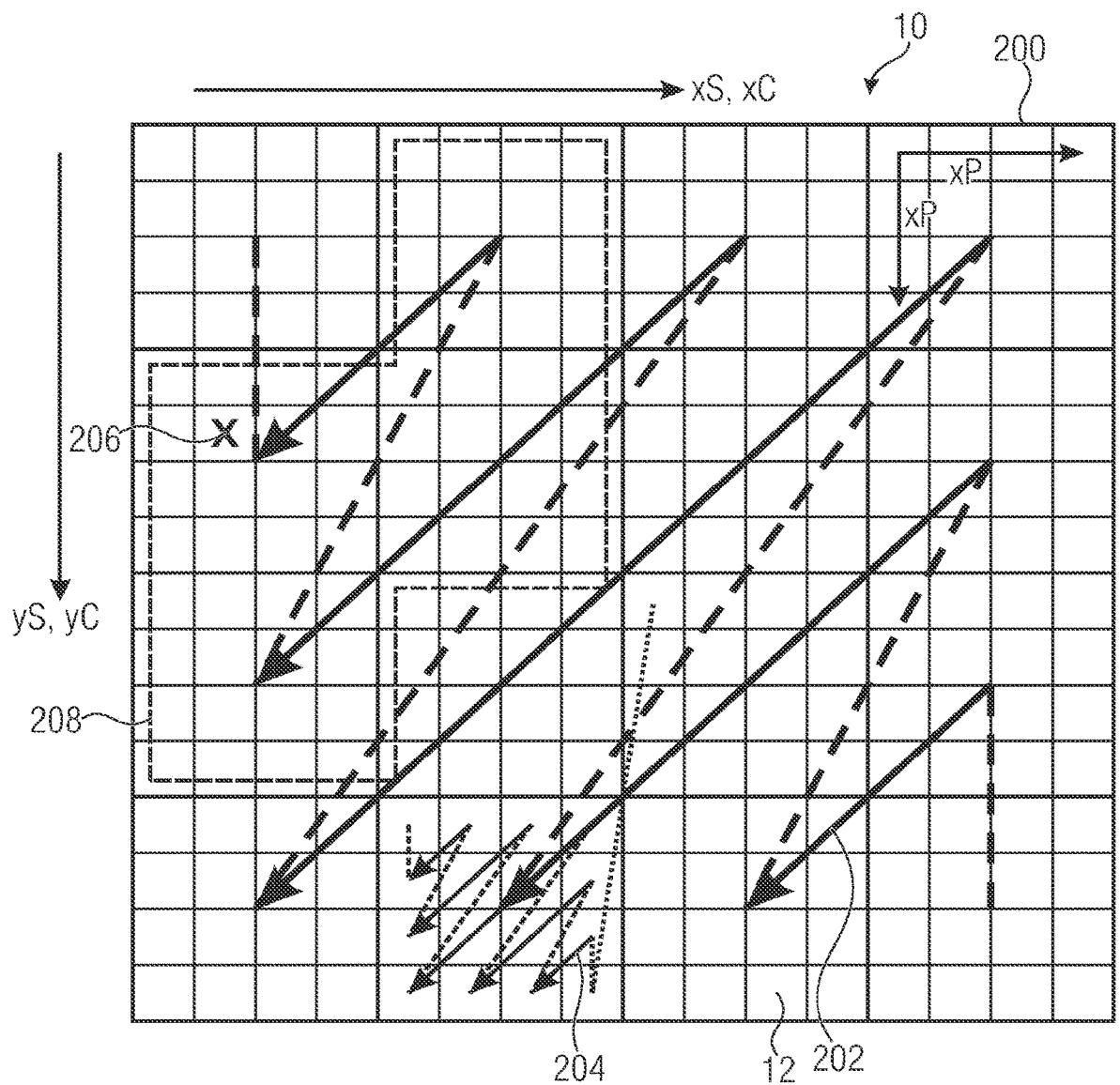
FIG. 13 shows a schematic diagram of a transform coefficient block so as to illustrate, in accordance with a further embodiment, a scan order among the transform coefficient blocks following a sub-block order defined among sub-blocks into which the transform coefficient block is subdivided in order to illustrate another embodiment for designing the parameterizable function for context selection and symbolization parameter determination.

See, for example, FIG. 13 showing a transform coefficient block 10, exemplarily consisting of an array of 16×16 transform coefficients 12. The transform coefficient block 10 is subdivided into sub-blocks 200 of 4×4 transform coefficients 12, each. The sub-blocks 200 are therefore arranged regularly in a 4×4 array. In accordance with the present embodiment, for coding the transform coefficient block 10, a significance map is coded within the data stream 32, the significant map indicating positions of significant transform coefficient levels 12, i.e. transform coefficient levels being unequal to 0. Then, the transform coefficient levels minus one of these significant transform coefficients may be coded within the data stream. The coding of the latter transform coefficient levels may be done as described above, namely by a mixed context adaptive entropy coding and variable length coding scheme using the common parametrizable function for selecting the context and determining the symbolization parameter. A certain scan order may be used in order to serialize or order the significant transform coefficients. One example of such a scan order is illustrated in FIG. 13: the sub-blocks 200 are scanned from the highest frequency (lower right) to DC (upper left), and within each sub-block 200 the transform coefficients 12 are scanned before the transform coefficients of the next sub-block in sub-block order are visited This is illustrated by arrows 202 indicating the sub-block scan, and 204 illustrating a portion of the actual coefficient scan. A scan index may be transmitted within the data stream 32 so as to allow for selecting among several scan paths for scanning the sub-blocks 200 and/or transform coefficients 12 within the sub-blocks, respectively. In FIG. 13, a diagonal scan is illustrated for both the sub-block scan 202 and the scan of transform coefficients 12 within each sub-block. Accordingly, at the decoder the significance map would be decoded, and the transform coefficient levels of the significant transform coefficients would be decoded using the just mentioned scan order and using the above embodiments exploiting the parametrizable function. In the description outlined in more detail below, xS and yS denote the sub-block column and sub-block row measured from the DC position on, i.e. the upper left corner of block 10, within which a currently coded/decoded transform coefficient is positioned. xP and yP denote the position of the currently coded/decoded transform coefficient measured from the upper left corner (DC coefficient position) of the current sub-block (xS, yS). This is illustrated in FIG. 13 for the upper right sub-block 200. xC and yC denote the currently decoded/coded transform coefficients position measured in transform coefficients from the DC position on. Further, as the block size for block 10 in FIG. 13, namely 16×16, has been chosen merely for illustration purposes, the embodiment further outlined below uses log2TrafoSize as a parameter denoting the size of the block 10, which is assumed to be quadratic. log2TrafoSize indicates the logarithm dualis of the number of transform coefficients within each row of transform coefficients of block 10, i.e. logi of the length of the edges of block 10 measured in transform coefficients. CtxIdxInc finally selects the context. Further, in the specific embodiment outlined below, it is assumed that the aforementioned significant map signals coded_sub_block_flag, i.e. a binary syntax element or flag, for the sub-blocks 200 of block 10 in order to signal, sub-block wise, whether within the respective sub-block 200 any significant transform coefficient is located or not, i.e. whether merely insignificant transform coefficients are located within the respective sub-block 200. If the flag is zero, merely insignificant transform coefficients are located within the respective sub-block.

Thus, in accordance with this embodiment, the following is performed by the context adaptive entropy decoder/encoder in order to select the context of significant_coeff_flag, i.e. a flag which is part of the significance map and signals for a certain transform coefficient of a sub-block for which coded_sub_block_flag signals that the respective sub-block 200 contains non-zero transform coefficients, as to whether the respective coefficient is significant, i.e. non-zero or not.

Inputs to this process are the colour component index cIdx, the current coefficient scan position (xC, yC), the scan order index scanIdx, the transform block size log2TrafoSize. Output of this process is ctxIdxInc.

The variable sigCtx depends on the current position (xC, yC), the colour component index cIdx, the transform block size and previously decoded bins of the syntax element coded_sub_block_flag. For the derivation of sigCtx, the following applies.

---

If log2TrafoSize is equal to 2, sigCtx is derived using ctxIdxMap[ ] specified in table 1 as follows.
  sigCtx = ctxIdxMap[ (yC << 2) + xC ]
Otherwise, if xC + yC is equal to 0, sigCtx is derived as follows.
sigCtx = 0
Otherwise, sigCtx is derived using previous values of
coded_sub_block_flag as follows.
  The horizontal and vertical sub-block positions xS and yS are set equal to (xC >> 2) and (yC >> 2), respectively.
  The variable prevCsbf is set equal to 0.
  When xS is less than (1 << (log2TrafoSize − 2 )) − 1, the following applies.
  prevCsbf += coded_sub_block_flag[ xS + 1 ][ yS ]
  When yS is less than ( 1 << (log2TrafoSize − 2 )) − 1, the following applies.
  prevCsbf += ( coded_sub_block_flag[ xS ][ yS + 1 ] << 1 )
  The inner sub-block positions xP and yP are set equal to (xC & 3 ) and (yC & 3 ), respectively.
  The variable sigCtx is derived as follows.
    If prevCsbf is equal to 0, the following applies.
    sigCtx = (xP + yP = = 0)?2:(xP + yP<3)?1:0

```
Otherwise, if prevCsbf is equal to 1, the following applies.
sigCtx = ( yP = = 0)?2:(yP = = 1 ) ? 1: 0
Otherwise, if prevCsbf is equal to 2, the following applies.
sigCtx = ( xP = = 0)?2:(xP = = 1 ) ? 1: 0
Otherwise (prevCsbf is equal to 3), the following applies.
sigCtx = 2
The variable sigCtx is modified as follows.
    If cIdx is equal to 0, the following applies.
        When ( xS + yS ) is greater than 0, the following applies.
        sigCtx += 3
        The variable sigCtx is modified as follows.
            If log2TrafoSize is equal to 3, the following applies.
                sigCtx += ( scanIdx = = 0) ? 9 : 15
            Otherwise, the following applies. sigCtx += 21
        Otherwise (cIdx is greater than 0), the following applies.
        If log2TrafoSize is equal to 3, the following applies.
        sigCtx += 9
        Otherwise, the following applies.
        sigCtx +=12
```

The context index increment ctxIdxInc is derived using the colour component index cIdx and sigCtx as follows.
If cIdx is equal to 0, ctxIdxInc is derived as follows.

$ctxIdxInc = sigCtx$

Otherwise (cIdx is greater than 0), ctxIdxInc is derived as follows.

$ctxIdxInc = 27 + sigCtx$

TABLE 1

Specification of ctxIdxMap [i]

| i | 0 | 1 | 2 | 3 | 4 | 5 | 6 | 7 | 8 | 9 | 10 | 11 | 12 | 13 | 14 |
|---|---|---|---|---|---|---|---|---|---|---|----|----|----|----|----|
| ctxIdxMap[i] | 0 | 1 | 4 | 5 | 2 | 3 | 4 | 5 | 6 | 6 | 8 | 8 | 7 | 7 | 8 |

As described above, for each significant transform coefficient, further syntax elements or sets of symbols may be conveyed within the data stream in order to signal the levels thereof. In accordance with the embodiment outlined below, for one significant transform coefficient the following syntax elements or sets of transform coefficients are transmitted: coeff_abs_level_greater1_flag, coeff_abs_level_greater2_flag (optional), and coeff_abs_level_remaining so that the level of the currently coded/decoded significant transform coefficient level TransCoeffLevel is $TransCoeffLevel = (coeff\_abs\_level\_remaining + baseLevel)*(1 - 2*coeff\_sign\_flag])$ With $baseLevel = 1 + coeff\_abs\_level\_greater1\_flag + coeff\_abs\_level\_greater2\_flag$ Please note that significant_coeff_flag is, per definition, 1 for significant transform coefficients, and accordingly, may be regarded as part of the coding of the transform coefficient, namely part of the entropy coded symbols thereof.

The context adaptive entropy decoder/encoder would, for example, perform the context selection for coeff_abs_level_greater1_flag as follows. For example, the current sub-block scan index i would increase along scan path 202 into the direction of DC, and the current coefficient scan index n would increase within the respective sub-block within which the currently coded/decoded transform coefficient position is located, along scan path 204, wherein, as outlined above, different possibilities exist for the scan paths 202 and 204, and same may actually be variable according to an index scanIdx.

Inputs to this process of selecting the context of coeff_abs_level_greater1_flag are the colour component index cIdx, the current sub-block scan index i and the current coefficient scan index n within the current sub-block. Output of this process is ctxIdxInc.

The variable ctxSet specifies the current context set and for its derivation the following applies.
    If this process is invoked for the first time for the current sub-block scan index i, the following applies.
        The variable ctxSet is initialized as follows.
        If the current sub-block scan index i is equal to 0 or cIdx is greater than 0, the following applies.

$ctxSet = 0$

Otherwise (i is greater than 0 and cIdx is equal to 0), the following applies.

$ctxSet = 2$

The variable lastGreater1Ctx is derived as follows.
            If the current sub-block with scan index i is the first one to be processed in this subclause for the current transform block, the variable lastGreater1Ctx is set equal to 1.
            Otherwise, the variable lastGreater1Ctx is set equal to the value of greater1Ctx that has been derived during the last invocation of the process specified in this subclause for the syntax element coeff_abs_level_greater1_flag for the previous sub-block with scan index i+1.
        When lastGreater1Ctx is equal to 0, ctxSet is incremented by one as follows.

$ctxSet = ctxSet + 1$

The variable greater1Ctx is set equal to 1.
    Otherwise (this process is not invoked for the first time for the current sub-block scan index i), the following applies.
        The variable ctxSet is set equal to the variable ctxSet that has been derived during the last invocation of the process specified in this subclause.
        The variable greater1Ctx is set equal to the variable greater1Ctx that has been derived during the last invocation of the process specified in this subclause.
        When greater1Ctx is greater than 0, the variable lastGreater1Flag is set equal to the syntax element coeff_abs_level_greater1_flag that has been used during the last invocation of the process specified in this subclause and greater1Ctx is modified as follows.

If lastGreater1Flag is equal to 1, greater1Ctx is set equal to 0.

Otherwise (lastGreater1Flag is equal to 0), greater1Ctx is incremented by 1.

The context index increment ctxIdxInc is derived using the current context set ctxSet and the current context greater1Ctx as follows.

*ctxIdxInc*=(*ctxSet*\*4)+Min(3, *greater1Ctx*)

When cIdx is greater than 0, ctxIdxInc is modified as follows.

*ctxIdxInc*=*ctxIdxInc*+16

The process of selecting the context of coeff_abs_level_greater2_flag could be made the same as coeff_abs_level_greater2_flag with the following difference: The context index increment ctxIdxInc is set equal to the variable ctxSet as follows.

ctxIdxInc=ctxSet

When cIdx is greater than 0, ctxIdxInc is modified as follows.

*ctxIdxInc*=*ctxIdxInc*+4

For the symbolization parameter selection, the following would be performed by the symbolization parameter determinator in order to determine the symbolization parameter which, here, comprises cLastAbsLevel and cLastRiceParam.

Input to this process is a request for a binarization for the syntax element coeff_abs_level_remaining[n], and baseLevel.

Output of this process is the binarization of the syntax element.

The variables cLastAbsLevel and cLastRiceParam are derived as follows.

If n is equal to 15, cLastAbsLevel and cLastRiceParam are set equal to 0.

Otherwise (n is less than 15), cLastAbsLevel is set equal to baseLevel+ coeff_abs_level_remaining[n+1] and cLastRiceParam is set equal to the value of cRiceParam that has been derived during the invocation of the binarization process as specified in this subclause for the syntax element coeff_abs_level_remaining[n+1] of the same transform block.

The variable cRiceParam is derived from cLastAbsLevel and cLastRiceParam as:

cRiceParam

Min*cLastRiceParam*+(*cLastAbsLevel*>(3\*(1«*cLastRiceParam*))?1:0), 4)

The variable eTRMax is derived from cRiceParam as:

*cTRMax*=4«*cRiceParam*

The binarization of coeff_abs_level_remaining may consist of a prefix part and (when present) a suffix part.

The prefix part of the binarization is derived by invoking, for example, Rice binarization process for the prefix part Min(cTRMax, coeff_abs_level_remaining[n]).

When the prefix bin string is equal to the bit string of length 4, for example, with all bits equal to 1, the bin string may consists of a prefix bin string and a suffix bin string. The suffix bin string may be derived using an Exp Golomb order-k binarization for the suffix part (coeff_abs_level_remaining[n]−cTRMax) with the Exp-Golomb order k set equal to cRiceParam+1, for example.

It should be noted that above embodiments may be varied. For example, the dependency on the colour component index cIdx could be left away. Merely one color component would, for example, be considered. Further, all of the explicit values could be varied. In so far, the just-outlined examples are to be interpreted broadly so as to also incorporate variations.

In the above example, the embodiments outlined above may advantageously be used in the following way. In particular, the determination of CtxIdxInc for coeff_abs_level_greater1_flag on the one hand and the symbolization parameter determination for coeff_abs_level_remaining is harmonized exploiting the above functions f and g by setting the function parameters in the following way.

To this end, FIG. 16 exemplarily shows a "current transform coefficient" illustrated with a cross 206. Same is representative for any transform coefficient with which any of the subsequently mentioned syntax elements are associated. It is positioned at (xP,yP)=(1,1) and (xC,yC)=(1,5) within current sub-block (xS,yS)=(0,1). Right-neighbor sub-block is at (xS,yS)=(1,1), bottom-neighbor sub-block is at (xS,yS)=(0,2) and the immediately previously coded sub-block depends on the scan path 202. Here, exemplarily, a diagonal scan 202 is shown, and the sub-block coded/decoded immediately preceding the current sub-bock is at (xS,yS)=(1,0).

Let's again, rewrite the formulas for the common parametrizable function $$g(f(x)) = \sum_{i=1}^{d_f} \delta'(f(x), (n_i)) \quad (1)$$

$$f(x) = \sum_t w_i \times h(x_i) \times \delta(x_i, t) \quad (2)$$

For selecting the context of significant_coeff_flag for current coefficient 206, the following could be computed by the entropy encoding/decoding apparatus. That is, same would use function (1) with (2) with having the function parameters t, h and w set as follows:

For function (2), $w_i$=1 for all $x_i$ within the neighboring sub-blocks to the right and to below of, the current sub-block, and $w_i$=0 elsewhere in block 10;

$h(x_i)$=1 for all $x_i$, within the neighboring sub-block to the right of the current sub-block; if present, same has been previously scanned in the sub-block scan 202; in case, more than one scan 202 is available, all may be such that, independent of scanIdx, the neighboring sub-block to the right has its coefficients coded/decoded prior to the current sub-block;

$h(x_i)$=$2^4$+1 for all $x_i$ within the neighboring sub-block below the current sub-block previously scanned in the sub-block san (independent of scanIdx);

$h(x_i)$=0 otherwise;

t=1;

If the value of f equals 0, this signals the case that none of the neighboring sub blocks to the right and below the current sub-block Nachbarn comprises any significant transform coefficient;

If the value of f falls between 1 and 16, both inclusively, this corresponds to the fact that coded_sub_block_flag equals 1 in the right neighbor sub-block If the value of f is a multiple of $2^4+1$ (without reminder). This corresponds to the fact that coded_sub_block_flag equals 1 in the right neighbor sub-block If the value of f is a multiple of $2^4+1$, but with reminder, this means that coded_sub_block_flag equals 1 for both neighboring sub-blocks, namely the one to the right of, and the one to below of, the current sub-block;

For function (1), n is set as follows with $d_f$ being 3:

$$n = (0, 2^4, m)$$

$$\text{with } m = \begin{cases} 2^{16} & \text{if } f(x) \leq 2^4 \\ f(x) - f(x)\%(2^4 + 1) & \text{else} \end{cases}$$

By this measure, the variable component of the context index is determined using g(f) with the above function parameters based on already coded(decoded coefficients.

For selecting the context of coeff_abs_greater1_flag, the following could be computed by the entropy encoding/decoding apparatus. That is, same would use function (1) with (2) with having the function parameter set as fellows:

For function (2), the parameters are set as follows:

$w_i=1$ is set for $x_i$ in the immediately preceding sub-block and the current sub-block, and zero for all the others.

$h(x_i) = 1$ for all $x_i$ in the current sub-block with $|x_i| = 1$ $h(x_i) = 2^4$ for all $x_i$ in the current sub-block with $|x_i| > 1$ $h(x_i) =$ $2^{16}$ for all $x_i$ in the immediately preceding sub-block $t = 2$ For function (1) n is set as follows with $d_f$ being 8:
$n=(0,1,2, 2^4, 2^{16}, 2^{16}+1, 2^{16}+2, 2^{16}+2^4)$ For selecting the context of coeff_abs_greater2_flag, the following could be computed by the entropy encoding/decoding apparatus. In particular, same would use function (1) with (2) with having the function parameter set as described above with respect to coeff_abs_greater2_flag, but with $d_f$ being 1:

$$n=(2^{16})$$

For determining the symbolization parameter for coeff_abs_level_remaining, the symbolization parameter determiner could use the common function (1) with the function parameters set as follows:

For function (2), the parameters are set as follows:

$w_i=1$ for all $x_i$ in the current cub-block, but zero elsewhere $h(x_i)=1$ fort he most recently—in accordance with the internal coefficient scan 204—visited coefficient $x_i$ for which coeff_abs_level_remaining has been coded, i.e. the level of which fell into the interval corresponding to the symbolization scheme;

$h(x_i)=0$ elsewhere in the template i=0

For function (1) n is et as follows:

$$n = \left(2^m \text{ with } m = \begin{cases} k & \text{if } k < 4 \\ 2^{16} & \text{if } k = 4 \end{cases}\right)$$

where k is the symbolization parameter, e.g. the Rice Parameter, for the afore-mentioned most recently—in accordance with the internal coefficient scan 204—visited coefficient. Using the resulting g(f), the symbolization parameter for the current coefficient 206 is determined.

The following syntax could be used to transfer the just-outlined syntax elements.

```
residual_coding( x0, y0, log2TrafoSize, cIdx ) {
    if( transform_skip_enabled_flag && !cu_transquant_bypass_flag && (log2TrafoSize = = 2
))
        transform_skip_flag[ x0 ][ y0 ][ cIdx ]
    last_significant_coeff_x_prefix
    last_significant_coeff_y_prefix
    if( last_significant_coeff_x_prefix > 3 )
        last_significant_coeff_x_suffix
    if( last_significant_coeff_y_prefix > 3 )
        last_significant_coeff_y_suffix
    lastScanPos = 16
    lastSubBlock = ( 1 << (log2TrafoSize = 2))*(1<<( log2TrafoSize − 2 )) − 1
    do {
        if( lastScanPos = = 0 ){
            lastScanPos = 16
            lastSubBlock− −
        }
        lastScanPos− −
        xS = ScanOrder[ log2TrafoSize − 2 ] [ scanIdx ] [ lastSubBlock ] [ 0 ]
        yS = ScanOrder[ log2TrafoSize − 2 ] [ scanIdx ] [ lastSubBlock ] [ 1 ]
        xC = (xS << 2 ) + ScanOrder[ 2 ] [ scanIdx ] [ lastScanPos ] [ 0 ]
        yC = ( yS << 2 ) + ScanOrder[ 2 ] [ scanIdx ] [ lastScanPos ] [ 1 ]
    } while( ( xC != LastSignificantCoeffX ) | | ( yC != LastSignificantCoeffY ))
    for( i = lastSubBlock; i >= 0, i− − ) {
        xS = ScanOrder[ log2TrafoSize − 2 ][ scanIdx ][ i ][ 0
        ] yS = ScanOrder[ log2TrafoSize − 2 ][ scanIdx ][ i ][
        1 ] inferSbDcSigCoeffFlag = 0
        if( (i < lastSubBlock) && (i > 0 )) {
            coded_sub_block_flag[ xS ][ yS ]
            inferSbDcSigCoeffFlag = 1
        }
        for( n = (i = = lastSubBlock) ? lastScanPos − 1 : 15; n >= 0; n− − ) {
            xC = ( xS << 2 ) + ScanOrder[ 2 ] [ scanIdx ] [ n ] [ 0 ]
            yC = ( yS << 2 ) + ScanOrder[ 2 ] [ scanIdx ] [ n ] [ 1 ]
            if( coded_sub_block_flag[ xS ][ yS ] && ( n > 0 | | !inferSbDcSigCoeffFlag )) {
                significant_coeff_flag[ xC ][ yC ]
```

```
            if( significant_coeff_flag[ xC ][ yC ] )
                inferSbDcSigCoeffFlag = 0
        }
    }
    firstSigScanPos =16
    lastSigScanPos = −1
    numGreater1Flag = 0
    lastGreater1ScanPos = −1
    for( n = 15 n >= 0; n− − ) {
        xC = ( xS << 2 ) + ScanOrder[ 2 ] [ scanIdx ] [ n ] [ 0
        ] yC = ( yS << 2 ) + ScanOrder[ 2 ][ scanIdx ] [ n ] [
        1 ] if( significant_coeff_flag[ xC ][ yC ] ) {
            if( numGreater1Flag < 8 ) {
                coeff_abs_level_greater1flag[ n ]
                numGreater1Flag++
                if( coeff_abs_level_greater1_flag[ n ] && lastGreater1ScanPos = = −1 )
                    lastGreater1ScanPos = n
            }
            if( lastSigScanPos = = −1)
                lastSigScanPos = n
            firstSigScanPos = n
        }
    }
    signHidden = (lastSigScanPos − firstSigScanPos > 3 && !cu_transquant_bypass_flag )
    if( lastGreater1ScanPos != −1 )
        coeff_abs_level_greater2_flag[ lastGreater1ScanPos ]
    for( n = 15; n >= 0; n− − ) {
        xC = ( xS << 2 ) + ScanOrder[ 2 ][ scanIdx ][ n ][ 0 ]
        yC = ( yS << 2 ) + ScanOrder[ 2 ][ scanIdx ][ n ][ 1 ]
        if( significant_coeff_flag[ xC ][ yC ] &&
            ( !sign_data_hiding_flag || !signHidden || n != firstSigScanPos ))
            coeff_sign_flag[ n ]
    }
    numSigCoeff = 0
    sumAbsLevel = 0
    for( n = 15; n >= 0; n− − ) {
        xC = ( xS << 2 ) + ScanOrder[ 2 ][ scanIdx ][ n ][ 0 ]
        yC = ( yS << 2 ) + ScanOrder[ 2 ][ scanIdx ][ n ][ 1 ]
        if( significant_coeff_flag[ xC ][ yC ] ) {
            baseLevel = 1 + coeff_abs_level_greater1_flag[ n ] +
            coeff_abs_level_greater2_flag[ n ]
            if( baseLevel = = (( numSigCoeff < 8 ) ? ( (n = = lastGreater1ScanPos) ? 3:2 ) :
            1 ) )
                coeff_abs_level_remaining[ n ]
            TransCoeffLevel[ x0 ] [ y0 ] [ cIdx ] [ xC ] [ yC ] =
                ( coeff_abs_level_remaining[ n ] + baseLevel) * ( 1 − 2 * coeff_sign_flag[ n ]
                )
            if( sign_data_hiding_flag && signHidden ) {
                sumAbsLevel += ( coeff_abs_level_remaining[ n ] + baseLevel)
                if( n = = firstSigScanPos && (( sumAbsLevel % 2) == 1))
                    TransCoeffLevel[x0][y0][cIdx][xC][yC] = −
                    TransCoeffLevel[x0][y0][cIdx][xC][yC]
            }
            numSigCoeff++
        }
    }
}
```

The syntax indicates that the level of the transformation coefficient is composed of coeff_abs_level_remaining and baseLevel, wherein baseLevel is composed of 1+coeff_abs_level_greater1_flag[n]+coeff_abs_level_greater2_flag[n]. 1 is used, as at this location (or at the time where the levels are reconstructed in the decoder) the syntax element is significant_coeff_flag=1. "First set" would then be the TU code (Rice code with parameterization equal to 0)—from this the first 3 syntax elements are formed. "Second set" then forms the syntax element coeff_abs_level_remaining.

As the boundary is shifted between "first"and "second set" the maximum value is either defined by coeff_abs_greater1_flag, coeff_abs_greater2_flag or by .significant_coeff_flag, hence the branches depending on the syntax elements in the table.

The above settings of the function parameters are still motivated a little in the following.

g(f) forms the sum of the neighboring coefficients and using the result a context and a desymbolization parameter are derived, wherein a later modification may be executed depending on the spatial position.

g(x) acquires one single value. This value corresponds to the result of the function f(x). Knowing this, the context selection and also the parameterization of the Rice parameter may be derived. significant_coeff_flag: As h may itself be a function of x, f(x) or any other function may be chained again and again. Function f(x) with $w_i-1$ for all positions in the right hand 4×4 sub-block, t=1 and h a function which is configured just like f(x) but inverted, so that in the end the value 0 or 1 results, i.e. h(x)=min(1, f(x)).

Equivalently, for the second entry this is applied to the bottom 4×4 sub-block. Then, prevCsbf=$h_0$+2×$h_1$, wherein refCsbf may also be a function h within f(x).

If t=∞ is set, the values of the syntax element coded_sub_block_flag may be derived. Thus, a value between 0 and including 3 is acquired as a result for the outermost f(x). The parameter n for g(x) would then either be (xP+yP), or xP, yP, or (0,0). If f(x)=0 results, then n=(xP+yP,xP+yP+3), for f(x)=1 n=(yP,yP+1) results, for f(x)=2 n=(xP,xP+1) results, and for f(x)=3 n=(0,0) results. So to speak, f(x) may be evaluated directly in order to determine n. The remaining formulae above merely describe an adoption depending on luma/chroma and a further dependency on the global position and scan. In case of a pure 4×4 block, f(x) may be configured so that the value for prevCsbf=4 (may also be different) and thus the mapping table may be reproduced. coeff_abs_level_greater1_flag: Here, the evaluation of the sub-blocks is similar, wherein only the preceding sub-block is evaluated. The result is, e.g. 1 or 2 (it only has to be two different values), wherein t=2. This corresponds to the selection of a base index depending on already decoded levels in the preceding sub-block. The direct dependency on the levels located within the sub-block may thus be acquired. Effectively, switching on by one index is executed when a 0 was decoded (limited to 3 starting by 1) and as soon as a 1 was decoded it is set to 0. If the arrangement is not considered, parameterization may be executed as follows, staring from 0. $w_i$=1 for all levels in the same sub-block and t=3, i.e. f(x) provides the number of levels with coeff_abs_greater1_flag=1. For a further function f(x) t=2, i e. the number of positions with an encoded syntax element coeff_abs_greater1_flag. The first function is limited, i.e. $h_0$=f(x)=min($f_0$(x),2) and the second function is limited with $h_1$=f(x)=max($f_1$(x),1). All of this chained with a delta function (0 if $h_1$=1, $h_0$ otherwise). For coeff_abs_greater2_flag only the derivation of the set is used ($w_i$ is set to 0 for the chained inner function). coeff_abs_level_remaining: The selection is only limited to the current sub-block and n is derived as described above.

With regard to the just outlined embodiment, the following is noted. In particular, in compliance with the above description, different possibilities exist with regard to the definition of the template, the template could be a moving template, the position of which is determined depending on the position of the current coefficient 206. The outline of such an exemplary moving template is depicted in FIG. 13 with a dashed line 208. The template is composed of the current sub-block, within which the current coefficient 206 is located, the neighboring sub-blocks to the right and below the current sub-block, as well as the one or more sub-blocks which immediately precede the current sub-block in the sub-block scan 202 or any of the sub-block scans 202 if there are several of them among which one is selectable using a scan index as explained above. As an alternative, the template 208 may simply encompass all transform coefficients 12 of block 10.

In the above example, there are further different possibilities for selecting the values of h and n. These values may, accordingly, set differently. This is somehow also true with respect to $w_i$, as far as those weights are concerned which are set to one. Same may be set to another non-zero value. They do not even have to be equal to each other. As $w_i$ is multiplied with h($x_i$), the same product value may be achieved by differently setting non-zero $w_i$'s. Moreover, the symbolization parameter does not have to be a Rice parameter or, differently speaking, the symbolization scheme is not restricted to be a Rice symbolization scheme. As to the context index selection, reference is made to the above description where it was already noted that a final context index may be obtained by adding the context index as obtained using function g(f) to some offset index which is, for example specific for the respective type of syntax element, i.e. specific for significant_coeff_flag, coeff_abs_level_greater1_flag, and coeff_abs_level_greater2_flag.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may he executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed:

1. A decoder for decoding a data stream comprising an encoded video including information related to a plurality of transform coefficients associated with the encoded video, the decoder comprising:
   a context adaptive entropy decoder configured for, for a current transform coefficient in a transform coefficient block, entropy decoding, using a processor, a first symbol including a coefficient significance flag based on a context, wherein the context is determined based on an operation involving a first previously decoded transform coefficient;
   an extractor configured for, using the processor, extracting a second symbol of the current transform coefficient from the data stream;
   a desymbolizer configured for, for the current transform coefficient, mapping the second symbol to a transform coefficient level based on a symbolization parameter, wherein the transform coefficient level is greater than a maximum level associated with the first symbol and the symbolization parameter is determined based on the operation involving a second previously decoded transform coefficient and an information component type including a color component type related to the transform coefficient block; and
   a picture decoder configured for applying, using a processor, predictive coding based on a prediction residual signal to reconstruct a block of a picture of the video, wherein the prediction residual signal is associated with the first symbol and the transform coefficient level,
wherein the decoder is configured for determining the first previously decoded transform coefficient based on a relative spatial arrangement of the first previously decoded transform coefficient relative to the current transform coefficient, wherein the spatial arrangement is based on a scan position of the current transform coefficient in the transform coefficient block.

2. The decoder according to claim 1, wherein the decoder is further configured for extracting, from the data stream, information on a position of a last non-zero transform coefficient among transform coefficients of a transform coefficient block along a predetermined scan order, wherein the plurality of transform coefficients encompasses the transform coefficients of the transform coefficient block from the last non-zero transform coefficient along the scan order to a DC transform coefficient of the transform coefficient block.

3. The decoder according to claim 2, wherein the desymbolizer is further configured for using a first symbolization scheme for mapping of the first symbol of the last non-zero transform coefficient to a level less than or equal to the maximum level, wherein a zero level does not apply for the last transform coefficient.

4. The decoder according to claim 2, wherein the context adaptive entropy decoder is further configured for entropy decoding the first symbol for the last non-zero transform coefficient using a context that is different from a context used in entropy decoding the first symbol of a transform coefficient other than the last non-zero transform coefficient.

5. The decoder according to claim 2, wherein the context adaptive entropy decoder traverses the transform coefficients of the transform coefficient block in a scan order leading from the last non-zero transform coefficient to the DC transform coefficient of the transform coefficient block.

6. The decoder according to claim 1, wherein the decoder is configured for decoding the plurality of transform coefficients from the data stream in two scans, wherein the context adaptive entropy decoder is configured for entropy decoding the first symbol for the transform coefficients from the data stream in an order corresponding to a first scan of the transform coefficients, and the extractor is configured for subsequently extracting, from the data stream, the second symbols, for the transform coefficients for which the first symbols are mapped onto the maximum level, in an order corresponding to a second scan of the transform coefficients.

7. The decoder according to claim 1, wherein the decoder is configured for decoding the plurality of transform coefficients from the data stream sequentially in one scan, wherein the second symbols are interspersed within the data stream between first symbols of the transform coefficients, and wherein the context adaptive entropy decoder and the extractor are configured for, for each transform coefficient in a scan order of the one scan, extracting, from the data stream, the second symbols of respective transform coefficients for which the first symbols are mapped onto the maximum level immediately subsequent to the context adaptive entropy decoder's entropy decoding of the first symbols of the respective transform coefficients for which the first symbols are mapped onto the maximum level.

8. The decoder according to claim 1, wherein the extractor is configured for extracting the second symbol from the data stream directly or using entropy decoding using a fixed probability distribution.

9. The decoder according to claim 1, wherein the desymbolizer is configured for mapping the first symbol to a transform coefficient level less than or equal to the maximum level associated with the first symbol based on a truncated unary binarization scheme.

10. The decoder according to claim 1, wherein the desymbolizer is further configured for mapping the second symbol based on a Rice code.

11. An encoder for encoding into a data stream information related to a plurality of transform coefficients associated with a video, the encoder comprising:
a picture encoder configured for applying, using a processor, predictive coding on a block of a picture of the video to obtain a prediction residual signal related to the block;
a context adaptive entropy encoder configured for, for a current transform coefficient in a transform coefficient block related to the prediction residual signal, entropy encoding, using a processor, a first symbol including a coefficient significance flag based on a context, wherein the context is determined based on an operation involving a first previously encoded transform coefficient; and
a symbolizer configured for mapping, using a processor, a transform coefficient level of the current transform coefficient to a second symbol based on a symbolization parameter, wherein the transform coefficient level is greater than a maximum level associated with the first symbol and the symbolization parameter is determined based on the operation involving a second encoded transform coefficient and an information component type including a color component type related to the transform coefficient block,
wherein the encoder is configured for determining the first previously encoded transform coefficient based on a relative spatial arrangement of the first previously encoded transform coefficient relative to the current transform coefficient, wherein the spatial arrangement is based on a scan position of the current transform coefficient in the transform coefficient block.

12. The encoder according to claim 11, wherein the encoder is further configured for inserting, into the data stream, information on a position of a last non-zero transform coefficient among transform coefficients of a transform coefficient block along a predetermined scan order, wherein the plurality of transform coefficients encompasses the transform coefficients of the transform coefficient block from the last non-zero transform coefficient along the scan order to a DC transform coefficient of the transform coefficient block.

13. The encoder according to claim 12, wherein the context adaptive entropy encoder is configured for entropy encoding the first symbol for the last non-zero transform coefficient using a context that is different from a context used in entropy encoding the first symbol of a transform coefficient other than the last non-zero transform coefficient.

14. The encoder according to claim 12, wherein the context adaptive entropy encoder traverses the transform coefficients of the transform coefficient block in a scan order leading from the last non-zero transform coefficient to the DC transform coefficient of the transform coefficient block.

15. The encoder according to claim 11, wherein the encoder is configured to encoding the plurality of transform coefficients into the data stream in two scans, wherein the context adaptive entropy encoder is configured for entropy encoding the first symbol for the transform coefficients into the data stream in an order corresponding to a first scan of the transform coefficients,
the encoder comprises an inserter configured for subsequently inserting into the data stream the second symbols, for the transform coefficients for which the first symbols are mapped onto the maximum level, in an order corresponding to a second scan of the transform coefficients.

16. The encoder according to claim 11, wherein the encoder is configured for encoding the plurality of transform coefficients into the data stream sequentially in one scan, wherein second symbols are interspersed within the data stream between first symbols of the transform coefficients, and
wherein the context adaptive entropy encoder and an inserter of the encoder are configured for, for each transform coefficient in a scan order of the one scan, inserting, into the data stream, the second symbols of respective transform coefficients for which the first symbols are mapped onto the maximum level, immediately subsequent to the context adaptive entropy encoder's entropy encoding of the first symbols of the respective transform coefficients for which the first symbols are mapped onto the maximum level.

17. The encoder according to claim 11, further comprising an inserter configured for inserting the second symbol into the data stream directly or using entropy encoding using a fixed probability distribution.

18. The encoder according to claim 11, wherein the symbolizer is configured for mapping the first symbol to a transform coefficient level less than or equal to the maximum level based on a truncated unary binarization scheme.

19. The encoder according to claim 11, wherein the symbolizer is configured for mapping the second symbol based on a Rice code.

20. A method for decoding a data stream comprising an encoded video including information related to a plurality of transform coefficients associated with the encoded video, the method comprising:
entropy decoding, for a current transform coefficient in a transform coefficient block, a first symbol including a coefficient significance flag based on a context, wherein the context is determined based on an operation involving a first previously decoded transform coefficient;
extracting a second symbol of the current transform coefficient from the data stream;
mapping, for the current transform coefficient, the second symbol to a transform coefficient level based on a symbolization parameter, wherein the transform coefficient level is greater than a maximum level associated with the first symbol and the symbolization parameter is determined based on the operation involving a second previously decoded transform coefficient and an information component type including a color component type related to the transform coefficient block; and
applying predictive coding based on a prediction residual signal to reconstruct a block of a picture of the video, wherein the prediction residual signal is associated with the first symbol and the transform coefficient level,
wherein the first previously decoded transform coefficient is determined based on a relative spatial arrangement of the first previously decoded transform coefficient relative to the current transform coefficient, wherein the spatial arrangement is based on a scan position of the current transform coefficient in the transform coefficient block.

21. The method according to claim 20, further comprising extracting, from the data stream, information on a position of a last non-zero transform coefficient among transform coefficients of a transform coefficient block along a predetermined scan order, wherein the plurality of transform coefficients encompasses the transform coefficients of the transform coefficient block from the last non-zero transform coefficient along the scan order to a DC transform coefficient of the transform coefficient block.

22. The method according to claim 20, further comprising:
- decoding the plurality of transform coefficients from the data stream sequentially in one scan, wherein the second symbols are interspersed within the data stream between first symbols of the transform coefficients, and
- for each transform coefficient in a scan order of the one scan, extracting, from the data stream, the second symbols of respective transform coefficients for which the first symbols are mapped onto the maximum level immediately subsequent to the entropy decoding of the first symbols of the respective transform coefficients for which the first symbols are mapped onto the maximum level.

23. The method according to claim 20, further comprising extracting the second symbol from the data stream directly or using entropy decoding using a fixed probability distribution.

24. The method according to claim 20, further comprising mapping the first symbol to a transform coefficient level less than or equal to the maximum level based on a truncated unary binarization scheme.

25. The method according to claim 20, wherein the mapping of the second symbol is based on a Rice code.

26. A non-transitory computer-readable medium for storing information related to a plurality of transform coefficients associated with an encoded video, comprising: a data stream stored in the non-transitory computer-readable medium, the data stream comprising encoded information related to first and second symbols of a current transform coefficient, and instructions to process the first and second symbols based on a method comprising:
- entropy decoding, for a current transform coefficient in a transform coefficient block, a first symbol including a coefficient significance flag based on a context, wherein the context is determined based on an operation involving a first previously decoded transform coefficient;
- extracting a second symbol of the current transform coefficient from the data stream;
- mapping, for the current transform coefficient, the second symbol to a transform coefficient level based on a symbolization parameter, wherein the transform coefficient level is greater than a maximum level associated with the first symbol and the symbolization parameter is determined based on the operation involving a second previously decoded transform coefficient and an information component type including a color component type related to the transform coefficient block; and
- applying predictive coding based on a prediction residual signal to reconstruct a block of a picture of the video, wherein the prediction residual signal is associated with the first symbol and the transform coefficient level,
- wherein the first previously decoded transform coefficient is determined based on a relative spatial arrangement of the first previously decoded transform coefficient relative to the current transform coefficient, wherein the spatial arrangement is based on a scan position of the current transform coefficient in the transform coefficient block.

27. The non-transitory computer-readable medium according to claim 26, the method further comprising extracting, from the data stream, information on a position of a last non-zero transform coefficient among transform coefficients of a transform coefficient block along a predetermined scan order, wherein the plurality of transform coefficients encompasses the transform coefficients of the transform coefficient block from the last non-zero transform coefficient along the scan order to a DC transform coefficient of the transform coefficient block.

28. The non-transitory computer-readable medium according to claim 26, the method further comprising mapping the first symbol to a transform coefficient level less than or equal to the maximum level based on a truncated unary binarization scheme.

29. The non-transitory computer-readable medium according to claim 28, wherein the mapping of the second symbol is based on a Rice code.

* * * * *